United States Patent
Musiol et al.

(10) Patent No.: US 10,741,762 B2
(45) Date of Patent: Aug. 11, 2020

(54) METHOD FOR THE DEPOSITION OF AN ORGANIC MATERIAL

(71) Applicant: CLAP Co., Ltd., Seoul (KR)

(72) Inventors: Thomas Musiol, Maxdorf (DE); Dieter Freyberg, Einselthum (DE); Jochen Brill, Speyer (DE)

(73) Assignee: CLAP Co., Ltd., Seoul (KR)

( * ) Notice: Subject to any disclaimer, the term of this patent is extended or adjusted under 35 U.S.C. 154(b) by 0 days.

(21) Appl. No.: 14/394,348

(22) PCT Filed: Apr. 30, 2013

(86) PCT No.: PCT/IB2013/053404
§ 371 (c)(1),
(2) Date: Oct. 14, 2014

(87) PCT Pub. No.: WO2013/164761
PCT Pub. Date: Nov. 7, 2013

(65) Prior Publication Data
US 2015/0123090 A1    May 7, 2015

(30) Foreign Application Priority Data

May 2, 2012    (EP) ..................................... 12166429

(51) Int. Cl.
*H01L 51/00*    (2006.01)
*C09B 57/10*    (2006.01)
(Continued)

(52) U.S. Cl.
CPC .......... *H01L 51/001* (2013.01); *C09B 57/004* (2013.01); *C09B 57/08* (2013.01);
(Continued)

(58) Field of Classification Search
CPC ............... H01L 51/001; H01L 51/0012; H01L 51/0026; H01L 51/0077; H01L 51/56;
(Continued)

(56) References Cited

U.S. PATENT DOCUMENTS 4,461,922 A    7/1984 Gay et al.
4,539,507 A    9/1985 Vanslyke et al.
(Continued)

FOREIGN PATENT DOCUMENTS

CN    101838792 A    9/2010
CN    101988185 A    3/2011
(Continued)

OTHER PUBLICATIONS

International Search Report dated Oct. 3, 2013, in PCT/IB2013/053404, filed Apr. 30, 2013.
(Continued)

*Primary Examiner* — Marcos D. Pizarro
*Assistant Examiner* — Sue Tang
(74) *Attorney, Agent, or Firm* — Oblon, McClelland, Maier & Neustadt, L.L.P.

(57) ABSTRACT

The present invention relates to a method for the deposition of at least one layer of an organic material on a substrate by (a) providing a source of a solid organic material in an atmosphere at a pressure comprised between 50 and 200 kPa, (b) heating said organic material to a first temperature to produce a vapor of said organic material, (c) exposing at least one surface of a substrate having a second temperature lower than said first temperature to said vapor to deposit organic material from said vapor onto said at least one surface of said substrate.

25 Claims, 6 Drawing Sheets

(51) Int. Cl.
   *C09B 57/08* (2006.01)
   *C23C 14/12* (2006.01)
   *C09B 57/00* (2006.01)
   *H01L 51/56* (2006.01)

(52) U.S. Cl.
   CPC .............. *C09B 57/10* (2013.01); *C23C 14/12* (2013.01); *H01L 51/0012* (2013.01); *H01L 51/0026* (2013.01); *H01L 51/0058* (2013.01); *H01L 51/0067* (2013.01); *H01L 51/0068* (2013.01); *H01L 51/0077* (2013.01); *H01L 51/0094* (2013.01); *H01L 51/56* (2013.01)

(58) Field of Classification Search
   CPC ............. H01L 51/0094; H01L 51/0058; H01L 51/0068; H01L 51/0067; C23C 14/12
   See application file for complete search history.

(56) References Cited

U.S. PATENT DOCUMENTS

| | | | |
|---|---|---|---|
| 4,720,432 A | | 1/1988 | Vanslyke et al. |
| 4,769,292 A | | 9/1988 | Tang et al. |
| 5,176,786 A | * | 1/1993 | Debe ................. C30B 23/02 117/105 |
| 5,344,948 A | * | 9/1994 | Verkade ................. C07F 5/022 534/11 |
| 6,198,091 B1 | | 3/2001 | Forrest et al. |
| 6,198,092 B1 | | 3/2001 | Bulovic et al. |
| 2001/0021415 A1 | | 9/2001 | Kido et al. |
| 2004/0046182 A1 | | 3/2004 | Chen et al. |
| 2005/0098726 A1 | | 5/2005 | Peumans et al. |
| 2005/0224905 A1 | | 10/2005 | Forrest et al. |
| 2005/0238806 A1 | * | 10/2005 | Yanashima ............. C23C 14/12 427/248.1 |
| 2005/0242345 A1 | | 11/2005 | Bao |
| 2006/0051612 A1 | * | 3/2006 | Ikeda ................... C07D 471/06 428/690 |
| 2006/0198946 A1 | | 9/2006 | Tan |
| 2007/0042178 A1 | * | 2/2007 | Sachweh ................. C23C 14/12 428/336 |
| 2008/0087878 A1 | | 4/2008 | Koenemann et al. |
| 2009/0130297 A1 | * | 5/2009 | Matsuo .................. C07F 5/069 427/66 |
| 2009/0280247 A1 | * | 11/2009 | Forrest .................... B05D 1/60 427/255.6 |
| 2011/0294257 A1 | * | 12/2011 | Shukla ................ H01L 51/0026 438/99 |
| 2012/0023684 A1 | | 2/2012 | Inuzuka et al. |
| 2012/0061658 A1 | * | 3/2012 | Forrest ................... B82Y 10/00 257/40 |
| 2012/0205598 A1 | * | 8/2012 | Li ........................ C09K 11/565 252/519.34 |

FOREIGN PATENT DOCUMENTS

| | | | | |
|---|---|---|---|---|
| DE | 103 29 247 A1 | | 1/2005 | |
| EP | 0 387 715 A2 | | 9/1990 | |
| EP | 0 532 798 A1 | | 3/1993 | |
| EP | 1 132 493 A2 | | 9/2001 | |
| EP | 1 512 768 A1 | | 3/2005 | |
| JP | 60-262971 | | 12/1985 | |
| JP | 2004228088 A | * | 8/2004 | ............. C23C 14/12 |
| JP | 2007-43104 | | 2/2007 | |
| WO | 99/25894 A1 | | 5/1999 | |
| WO | 2005/019373 A2 | | 3/2005 | |
| WO | 2006/092124 A1 | | 9/2006 | |
| WO | WO 2007/026649 A1 | | 3/2007 | |
| WO | 2007/074137 A1 | | 7/2007 | |
| WO | 2007/093643 A1 | | 8/2007 | |
| WO | 2007/116001 A2 | | 10/2007 | |
| WO | 2009/077349 A1 | | 6/2009 | |
| WO | 2010/049512 A1 | | 5/2010 | |
| WO | WO 2010/136082 A1 | | 12/2010 | |
| WO | WO 2011/034011 A1 | | 3/2011 | |

OTHER PUBLICATIONS

Written Opinion of the International Searching Authority dated Oct. 3, 2013, in PCT/IB2013/053404, filed Apr. 30, 2013.
Cédric Rolin, et al., "Vapor Phase Growth of Functional Pentacene Films at Atmospheric Pressure", Advanced Functional Materials, vol. 22, 2012, pp. 5050-5059.
P.E. Burrows, et al. "Organic vapor phase deposition: a new method for the growth of organic thin films with large optical non-linearities", Journal of Crystal Growth, vol. 156, 1995, pp. 91-98.
M. A. Baldo, et al., "Low pressure organic vapor phase deposition of small molecular weight organic light emitting device structures", Appl. Phys. Lett., vol. 71, No. 21, XP 12019116, Nov. 24, 1997, pp. 3033-3035.

* cited by examiner

METHOD FOR THE DEPOSITION OF AN ORGANIC MATERIAL

FIELD OF THE INVENTION

The use of organic vapor phase deposition has made progress towards the low cost, large scale deposition of small molecular weight organic layers with numerous potential applications. It is expected that, in the future, not only the classical inorganic semiconductors but increasingly also organic semiconductors based on low molecular weight or polymeric materials will be used in many sectors of the electronics industry. In many cases, these organic semiconductors have advantages over the classical inorganic semiconductors, for example better substrate compatibility and better processibility of the semiconductor components based on them. Often, organic semiconductor materials are simpler to process because they can be deposited at lower temperatures than inorganic semiconductors, allowing the use a wider range of substrate materials. For instance, they allow processing on flexible substrates such as plastic materials and enable their interface orbital energies to be adjusted precisely to the particular application range by the methods of molecular modeling. The significantly reduced costs of such components have brought a renaissance to the field of research of organic electronics.

Organic electronics is concerned principally with the development of new materials and manufacturing processes for the production of electronic components based on organic semiconductor layers. These include in particular organic field-effect transistors (OFETs) and organic electroluminescent devices (hereinafter abbreviated as "EL" devices). Great potential for development is ascribed to organic field-effect transistors, for example in storage elements and integrated optoelectronic devices. An organic electroluminescent device is a self-emission device utilizing the principle that a fluorescent material emits light by the recombination energy of holes injected from an anode and electrons injected from a cathode when an electric field is applied. EL devices in form of organic light-emitting diodes (OLEDs) are especially of interest as an alternative to cathode ray tubes and liquid-crystal displays for producing flat visual display units. Owing to the very compact design and the intrinsically low power consumption, devices which comprise OLEDs are suitable especially for mobile application, for example for applications in cell phones, laptops, etc. In addition, OLEDs offer great advantages over the illumination technologies known to date, especially a particularly high efficiency. Organic photovoltaics is concerned principally with the development of new materials for organic solar cells. A great potential for development is ascribed to materials which have maximum transport widths and high mobilities for light-induced excited states (high exciton diffusion lengths) and are thus advantageously suitable for use as an active material in so-called excitonic solar cells. It is generally possible with solar cells based on such materials to achieve very good quantum yields.

In most of the organic electronic devices, the organic semiconducting material is formed as a thin layer on a substrate.

Several methods for forming a layer of a semi-conductive organic material on a device are known in the art.

Some methods employ the elaborate layer deposition techniques known from inorganic semiconductor processing such as physical vapor deposition techniques. Usually these processes are conducted in a vacuum chamber. The organic material is applied to a metal support which is heated e.g. by resistive or inductive heating or even by using an electron gun. The main advantages of vacuum deposition techniques are the easy control of the thickness and purity of the film, and the fact that highly ordered films can be realized by monitoring the deposition rate and the temperature of the substrate. The primary drawbacks are that theses techniques require sophisticated instrumentation and that the establishment of a high vacuum prior to deposition leads to increased production times so that these methods are rather costly on an industrial scale.

In order to produce single crystals of semiconductor material, physical vapor transport techniques has been suggested where the semiconducting material on a support is heated in a horizontal oven filled with an inert carrier gas such as argon. The vapor is crystallized on a plate which is kept at a slightly lower temperature that the support. The single crystal is peeled off the plate and place onto a suitable substrate such as a highly doped silicon wafer to form an organic single crystal layer of an electronic device. These techniques are costly because the deposition rate has to be kept rather low in order to obtain suitable single crystals and is therefore on suitable for a cheap industrial scale production process.

WO 2009/077349 describes a process for the preparation of an electronic device, which process comprises application or deposition of particles of a semiconducting material consisting essentially of an organic semiconductor, for example amounting to 60 to 100% by weight of the particle material, on a suitable surface, and converting these particles into a semiconducting layer on a substrate by application of pressure and optionally elevated temperatures.

In a postpublished article (published online Jul. 27, 2012) in Adv. Funct. Mater. 2012, 22, 5050-5059, C. Rolin et al. describe the vapour phase growth of functional pentacene films at atmospheric pressure.

WO 99/25894 describes the deposition of organic thin films by a low pressure vapour phase deposition.

Journal of Crystal Growth 156 (1995), p. 91-98 describes an organic vapour phase deposition, wherein a volatile precursor of each component is carried as a vapour to a reaction chamber by a controlled stream of an inert carrier gas.

Appl. Phys. Lett. 71 (21), p. 3033-3035 describes the low pressure organic vapour phase deposition of small molecular weight OLED device structures. The OLEDs were prepared by gas phase deposition at higher temperatures and under reduced pressure in the presence of an inert carrier gas stream.

US 2006/0198946 describes a method for fabricating a self-emission device, including forming a bottom electrode on a substrate directly or via another layer and forming a top electrode on a stack of layers overlying the bottom electrode. According to this method the deposition is performed using a deposition material gas generation portion provided in a deposition chamber, with the deposition chamber held under pressure. To hold the deposition chamber under pressure an inert gas that serves as pressure control gas is mandatorily introduced into the deposition chamber. The pressure in the chamber can be less than atmospheric pressure, preferably in a range of from $10^{-1}$ to $10^3$ Pa, but may also be set to a pressure higher than atmospheric pressure.

US 2008/0087878 A1 describes the use of perylene diimide derivatives as air-stable n-channel organic semiconductors. This document teaches in very general terms to apply the organic semiconductor to a substrate by physical vapour deposition. The disclosed pressure range for the deposition is from about 0.0001 to 1.5 bar. In all of the working examples an ultra-high vacuum is employed.

US 2012/0023684 A1 describes a method of dyeing an object comprising:

a first step of placing a sublimable dye and an object to face each other at a predetermined distance under normal pressure and heating the sublimable dye to sublimate toward the object, wherein the distance between the sublimable dye and the object is in a range of from 0.1 mm to 10 mm and wherein the heating is effected from the backside of the dye by using a laser beam;

a second step of applying the sublimable dye over an entire region intended to be dyed by moving the object with respect to the sublimation position of the sublimable dye; and a third step of heating at least a part of the region of the object to which the sublimable dye is applied to fixate the sublimable dye.

JP 60-262971 A describes a method of forming a thin film, wherein an organic material is subjected to a vapour deposition at normal pressure. This document does not give a specific teaching of the employed process conditions.

Other methods employ the processing of solutions of the organic semiconductor material. In these methods, the solid small-molecular organic semiconducting material is dissolved in a suitable solvent and the solution is applied to a suitable substrate and dried to form a thin film or layer. Especially for the large scale production of electronic devices coating techniques such as spin-coating, ink-jet printing or other coating technologies have been suggested in prior art. However, small-molecular organic semiconducting materials are difficult to dissolve in common solvents and specific solvents for individual materials which are often harmful for the environment which also increases overall production costs. Further, spin-coating requires high viscosity solutions and is therefore usually not applicable to small molecules. Also, organic semiconducting layers produced by coating techniques often exhibit a poor charge carrier mobility and an insufficient on/off ratio and are therefore not suitable for highly sophisticated electronic devices such as organic field-effect transistors (OFETs).

In addition to semiconducting layers, organic layers can be employed for other purposes in organic electronic devices. For instance, non-conduction organic materials can be used as insulating layers or dielectric layers.

Thus, there is a need for an improved method of producing organic layers on various substrates. This method shall be especially suitable for the production of organic electronic devices in a cost effective manner and which allows for an industrial scale production.

SUMMARY OF THE INVENTION

The present invention relates to a method for the deposition of at least one layer of an organic material on a substrate by
(a) providing a source of a solid organic material in an atmosphere at a pressure comprised between 50 and 200 kPa,
(b) heating said organic material to a first temperature to produce a vapor of said organic material,
(c) exposing at least one surface of a substrate having a second temperature lower than said first temperature to said vapor to deposit organic material from said vapor onto said at least one surface of said substrate.

In a preferred embodiment, the present invention pertains to a method of producing an electronic device comprising the deposition of at least one layer of an organic material on a substrate by
(a) providing a source of a solid organic material in an atmosphere at a pressure comprised between 50 and 200 kPa,
(b) heating said organic material to a first temperature to produce a vapor of said organic material,
(c) exposing at least one surface of a substrate having a second temperature lower than said first temperature to said vapor to deposit organic material from said vapor onto said at least one surface of said substrate.

A further preferred embodiment is a method for the deposition of a polycrystalline organic semiconductor layer on a substrate by
(a) providing a source of at least one organic semiconductor material in an atmosphere that comprises air or consists of air at a pressure between 50 and 200 kPa,
(b) heating the organic semiconductor material to a first temperature in a range of from 20 to 350° C. to produce a vapor of the organic semiconductor material,
(c) exposing at least one surface of a substrate having a second temperature lower than the first temperature to the vapor to deposit the organic semiconductor material from said vapor onto at least one surface of the substrate.

A further preferred embodiment is a method for the deposition of a layer of an organic electroluminescent device on a substrate, wherein the layer is selected from hole-injecting layers, hole-transporting layers, light-emitting layers, electron-transporting layers and electron-injecting layers, by
(a) providing a source of at least one organic material for the layer of the organic electroluminescent device in an atmosphere that comprises air or consists of air at a pressure between 50 and 200 kPa,
(b) heating the organic material to a first temperature in a range of from 20 to 350° C. to produce a vapor of the organic semiconductor material,
(c) exposing at least one surface of a substrate having a second temperature lower than the first temperature to the vapor to deposit the organic material from said vapor onto at least one surface of the substrate.

In particular, this method is employed for the deposition of a hole transporting layer of an organic light emitting diode.

A further preferred embodiment is a method for the deposition of a self-assembled monolayer on a substrate by
(a) providing a source of at least one material capable of forming self assembled monolayers in an atmosphere that comprises air or consists of air at a pressure between 50 and 200 kPa,
(b) heating the material to a first temperature in a range of from 20 to 350° C. to produce a vapor of the organic semiconductor material,
(c) exposing at least one surface of a substrate having a second temperature lower than the first temperature to the vapor to deposit the material from said vapor onto at least one surface of the substrate.

A further object of the invention is a coated substrate, obtainable by a process as defined in above and in the following, comprising on at least a part of its surface at least one layer of an organic material.

A further object of the invention is the use of a coated substrate as defined above and in the following as or in an organic electronic device, preferably selected from an organic field effect transistor or an organic solar cell or an organic light emitting diode.

DETAILED DESCRIPTION OF THE INVENTION

The process of the invention is particularly suitable for the production of layers of an organic material in various electronic devices. In the sense of this invention, the term "electronic device" encompasses classical electronic devices as well as organic electronic devices. A special embodiment is the production of an organic electronic device comprising the deposition of at least one layer of an organic material on a substrate by the process of the invention.

Suitable non-organic electronic devices are customary devices known from the art. Examples of such components are field-effect transistors (FETs), bipolar junction transistors (BJTs), tunnel diodes, converters, light-emitting components (in particular LEDs), Graetzel solar cells, dye sensitized solar cells, inverters, biological and chemical detectors or sensors, temperature-dependent detectors, photodetectors (such as polarization-sensitive photodetectors), gates (in particular AND, NAND, NOT, OR, TOR and NOR gates), registers, switches, timer units, static or dynamic stores and other dynamic or sequential, logical or other digital components including programmable switches. This comprises integrated circuits (ICs), e.g. on the basis of MOSFETs (metal oxide semiconductor field-effect transistors), for example for microprocessors, microcontrollers, static RAM and other digital logic circuits.

Preferably, the layer of said organic material can be is selected from the group consisting of
  organic semiconducting layers,
  dielectric or insulating layers,
  layers comprising at least one surface modifying agent,
  layers with electron-conducting properties (electron transport layer, ETL),
  layers which comprise a hole-conducting material (hole transport layer, HTL),
  exciton- and/or electron-conducting layers
  multiplication layers,
  hole-injecting layers,
  hole-transporting layers,
  light-emitting layers,
  electron-transporting layers,
  electron-injecting layers,
  encapsulation layers,
  light-absorbing layers,
  sensor layers,
  photosensitive layers,
  barrier layers, and
  self-assembled monolayers such as silanes, phosphonic acids, etc. Suitable are those mentioned below.

It has surprisingly been found that the method of the present invention yields high-quality polycrystalline films on a wide variety of supports in an atmosphere which is at ambient pressure or an atmosphere which is at a pressure close to ambient pressure, without having to resort to costly high-vacuum techniques of prior art physical vapor deposition processes. For instance, organic semiconducting layers produced with the method of the present invention, yield high charge carrier mobilities, e.g. of up to 0.9 $cm^2/Vs$, and high on/off ratios, e.g. of more than $1 \times 10^5$. Such layers can, for example, be employed advantageously to produce organic field effect transistors. Furthermore, organic semiconducting layers produced with the method of the present invention show an remarkably improved storage stability over layers produced with the conventional vacuum deposition method.

The method according to the invention is especially advantageous for the deposition of a polycrystalline organic semiconductor layer on a substrate. Surprisingly, by performing the deposition at ambient pressure or close to ambient pressure polycrystalline films can be obtained wherein the grain size is remarkably higher than in layer prepared by spincoating or deposition under high vacuum conditions. The grain size of polycrystalline organic semiconductor layers can be determined from the XRD measurements using the Debye-Scherrer formula:

$$d = (0.9 * \lambda)/\Delta * \cos \theta$$

wherein d is the grain size, $\lambda$ the wavelength of the X-rays used in the XRD experiment, $\Delta$ the full width at half maximum of the diffraction peak and $\theta$ the angle corresponding to the diffraction peak.

The method according to the invention allows the formation of polycrystalline organic semiconductor layers, wherein the grain size is preferably at least 8 nm, more preferably at least 10 nm and in particular at least 25 nm.

The method according to the invention is especially advantageous for the deposition of layers of organic light emitting diodes (OLEDs). Thus, the deposition of the hole transport by the method of this invention leads to advantageous application properties, e.g. an increase in the external quantum efficiency (EQE), a reduction of the voltage necessary to produce a certain brightness or an increase in the lifetime of the OLED. The external quantum efficiency (EQE) is the amount of generated photons escaped from a substance or a device divided by the amount of electrons flowing through it.

The method according to the invention allows the deposition of at least one organic material to modify the surface-properties of a substrate. The surface of the substrate is preferably modified with at least one compound which is suitable for binding to the surface of the substrate and to organic materials that shall be deposited onto the thus modified substrate afterwards. In a preferred embodiment, the surface modifying agent is capable of forming so-called self assembled monolayers (SAM).

According to a preferred embodiment of the method of the present invention, the pressure of the atmosphere in which the solid organic material is vaporized is in a range of from 80 to 120 kPa. More preferably, the atmosphere is at ambient pressure, i.e. at a pressure of approximately 100 kPa.

The atmosphere, in which the solid organic material is vaporized preferably consists essentially of a gas or a gas mixture that is inert towards the organic material. Suitable gases are selected from air, noble gases, nitrogen, carbon dioxide and mixtures thereof. Suitable noble gases are e.g. argon, helium, neon and mixtures thereof.

In particular, the atmosphere in which the organic material is vaporized comprises or consists of air.

According to one special embodiment of the method of the present invention, the atmosphere is air which allows for a simple and cheap production process. It has surprisingly been found that for instance the presence of oxygen in ambient air does not deteriorate the electric properties of a semiconductor layer produced with the method of the present invention. In addition, the atmosphere can contain suitable gaseous dopant materials which can be co-deposited onto the substrate in order to modify or fine-tune electrical and/or mechanical properties of the layer. The atmosphere can also comprise at least one reactive substance for further modification of the layer, so that physical vapor deposition of the organic material constituting the organic layer can be combined with chemical vapor deposition techniques.

According to a preferred embodiment of the invention, the solid organic material is heated to a temperature at which sufficient vapor is generated in order to obtain suitable deposition rates on the substrate. Vapor of the organic material may be generated through evaporation or sublimation of the organic material. Usually, the material is heated up to a temperature above the evaporation temperature or above the sublimation temperature of the organic material. Heating of the organic material can be accomplished by a variety of methods. For instance, the solid organic material can be placed on a support, for instance a metallic plate or quartz plate, which can be heated via resistive heating or inductive heating. According to another variant, the solid organic material can be heated by microwave heating or via an electron gun.

Preferably, the temperature of the heated organic material is controlled in order to provide for a constant vaporization rate.

Preferably, the first temperature and the second temperature are both higher than 20° C., more preferably higher than 25° C., in particular higher than 30° C.

Preferably, the first temperature is in a range of from 20 to 350° C., more preferably in a range of from 25 to 210° C.

Preferably, the second temperature is in a range of from 20 to 340° C., more preferably in a range of from 20 to 200° C.

Preferably, the difference between the first temperature and the second temperature is in a range of from 10 to 330° C., more preferably in a range of from 10 to 100° C.

In accordance with the method of the present invention, at least one surface of the substrate is exposed to said vapor. This allows deposition of a layer of said vapor onto the surface of the substrate in form of a thin polycrystalline film. In order to accomplish a suitable deposition rate, the temperature of the substrate, i.e. the second temperature mentioned above, is kept below the melting temperature or the sublimation temperature of the organic material. Quality and morphology, e.g. crystal grain size, of the organic layer can therefore further be modified by adjusting the temperature of the source of the organic material and/or the temperature of the substrate on which the organic vapor is deposited and/or the temperature differential between source and substrate.

According to the method of the present invention, at least one surface of the substrate is exposed to the vapor of the organic material in order to deposit organic material, preferably as a polycrystalline film, onto said at least one surface of the substrate. Preferably, the material transfer from the source to the substrate is effected by the vapor of the vaporized organic material without requiring the atmosphere acting as a carrier gas.

According to a preferred embodiment of the method of the invention, the duration for which the substrate is exposed to the vapor is controlled. For instance, a mask provided with a shutter can be arranged in front of the surface of the substrate which allows exposing the surface of the substrate to the vapor for a predetermined time. The substrate can repeatedly be exposed to the vapor for a predetermined time and certain annealing procedures can be foreseen in between exposures, for instance by raising or lowering the temperature of the substrate.

Temporary exposure of the substrate to the vapor can also be achieved by providing relative movement between substrate and vapor source. The relative movement can selected from a range of an essentially orthogonally to an essentially parallel movement with respect to the normal vector of the vapor source. In a preferred embodiment, the substrate is moved through areas with different concentration of the organic material in the vapor. Preferably, the substrate is at least once moved through the vapor. More preferably, however, the substrate is repeatedly moved through the vapor. The transport velocity of the substrate, the number of exposures which the substrate is exposed to the vapor and the distance between the source of the organic material and the surface of the substrate onto which the organic layer is deposited from the vapor can be modified and/or controlled in order to modify structure and morphology of the layer as well as the layer thickness. The substrate can for instance be moved in form of a belt through the vapor, thus allowing for a continuous production method. In case of a rigid substrate, the substrate, for instance a silicon waver, may be fixed to the belt. If a flexible substrate is employed, the belt itself may be the substrate. The substrate may also be blazed on a rotating support to provide for a repeated exposure to the vapor, thus allowing for a semi-continuous production method.

In a preferred embodiment of the invention, the substrate is arranged above the source of the solid organic material so that transport of the organic material from the source to the substrate can be accomplished using only the convective upward movement of the vapor.

In order to properly define the contact area, a mask limiting the cross-sectional area of the uprising vapor can be provided between source and substrate. Also, a vertical contact chamber can be employed which is provided with suitable inlet and outlet openings for the substrate in order to allow for a either repeated or non-repeated temporary contact between substrate and vapor.

A wide variety of substrates may be used in the method of the present invention. The substrates may be made of virtually any materials which are stable under the process conditions of the method of the invention. Thus, the substrate may include organic and inorganic materials or composite materials. For example, the substrate may comprise inorganic glasses, quartz, ceramic foils or plates, undoped or doped inorganic semiconductors, such as silicon wafers, polymeric materials (for example, acrylics, epoxies, polyamides, polycarbonates, polyimides, polyketones, poly(oxy-1,4-phenyleneoxy-1,4-phenylenecarbonyl-1,4-phenylene), sometimes referred to as poly(ether ether ketone) or PEEK, polynorbornenes, polyphenyleneoxides, poly(ethylene naphthalenedicarboxylate) (PEN), poly(ethylene terephthalate) (PET), poly(phenylene sulfide) (PPS)), filled polymeric materials (for example, fiber-reinforced plastics (FRP)), and coated or uncoated metallic foils or plates.

Preferably, the distance between said source and said substrate is in a range of form 0.1 to 20 mm, more preferably in a range of from 0.5 to 3 mm.

Preferably, the deposition rate of the at least one layer of an organic material on the substrate is in a range of from 1 to 200 nm/min, more preferably in a range of from 1 to 600 nm/min.

Organic Material

The process of the invention is suitable for the deposition of various organic materials on substrates for the use in an electronic device.

Suitable solid organic materials are e.g. selected from:
organic semiconductor materials,
dielectrics or insulators,
surface modifying agents, e.g. adhesion promoting agents, coupling agents, etc.,
organic materials with exciton-blocking properties, organic hole conducting materials,
organic exciton blocking and/or electron conducting materials.

Organic Semiconductor Materials

In the context of the invention, the expression "halogen" denotes in each case fluorine, bromine, chlorine or iodine, particularly chlorine, bromide or iodine.

In the context of the present invention, the expression "alkyl" comprises straight-chain or branched alkyl groups. Alkyl is preferably $C_1$-$C_{30}$-alkyl, more preferably $C_1$-$C_{20}$-alkyl and most preferably $C_1$-$C_{12}$-alkyl. Examples of alkyl groups are especially methyl, ethyl, n-propyl, isopropyl, n-butyl, isobutyl, sec-butyl, tert-butyl, n-pentyl, neo-pentyl, n-hexyl, n-heptyl, n-octyl, n-nonyl, n-decyl, n-undecyl, n-dodecyl, n-tridecyl, n-tetradecyl, n-hexadecyl, n-octadecyl and n-eicosyl.

The expression alkyl also comprises alkyl radicals whose carbon chains may be interrupted by one or more nonadjacent groups which are selected from —O—, —S—, —$NR^f$—, —C(=O)—, —S(=O)— and/or —S(=O)$_2$—. $R^f$ is preferably hydrogen, alkyl, cycloalkyl, heterocycloalkyl, aryl or hetaryl.

Substituted alkyl groups may, depending on the length of the alkyl chain, have one or more (e.g. 1, 2, 3, 4, 5 or more than 5) substituents. These are preferably each independently selected from cycloalkyl, heterocycloalkyl, aryl, hetaryl, fluorine, chlorine, bromine, hydroxyl, mercapto, cyano, nitro, nitroso, formyl, acyl, COOH, carboxylate, alkylcarbonyloxy, carbamoyl, $SO_3H$, sulfonate, sulfamino, sulfamide, amidino, $NE^1E^2$ where $E^1$ and $E^2$ are each independently hydrogen, alkyl, cycloalkyl, heterocycloalkyl, aryl or hetaryl. Cycloalkyl, heterocycloalkyl, aryl and hetaryl substituents of the alkyl groups may in turn be unsubstituted or substituted; suitable substituents are the substituents mentioned below for these groups. In a preferred embodiment, substituted alkyl is $C_{7-20}$ arylalkyl, e.g. benzyl or phenylethyl.

Carboxylate and sulfonate respectively represent a derivative of a carboxylic acid function and a sulfonic acid function, especially a metal carboxylate or sulfonate, a carboxylic ester or sulfonic ester function or a carboxamide or sulfonamide function. Such derivatives include, for example, esters with $C_1$-$C_4$-alkanols, such as methanol, ethanol, n-propanol, isopropanol, n-butanol, sec-butanol and tert-butanol.

The above remarks regarding alkyl also apply to the alkyl moiety in alkoxy, alkylthio (=alkylsulfanyl), monoalkylamino and dialkylamino. In the context of the present invention, the term "cycloalkyl" denotes a mono-, bi- or tricyclic hydrocarbon radical having usually from 3 to 20, preferably 3 to 12, more preferably 5 to 12, carbon atoms such as cyclopropyl, cyclobutyl, cyclopentyl, cyclohexyl, cycloheptyl, cyclooctyl, cyclododecyl, cyclopentadecyl, norbornyl, bicyclo[2.2.2]octyl or adamantyl.

Substituted cycloalkyl groups may, depending on the ring size, have one or more (e.g. 1, 2, 3, 4, 5 or more than 5) substituents. These are preferably each independently selected from alkyl, alkoxy, alkylthio, cycloalkyl, heterocycloalkyl, aryl, hetaryl, fluorine, chlorine, bromine, hydroxyl, mercapto, cyano, nitro, nitroso, formyl, acyl, COOH, carboxylate, alkylcarbonyloxy, carbamoyl, $SO_3H$, sulfonate, sulfamino, sulfamide, amidino, $NE^3E^4$ where $E^3$ and $E^4$ are each independently hydrogen, alkyl, cycloalkyl, heterocycloalkyl, aryl or hetaryl. Examples of substituted cycloalkyl groups are especially 2- and 3-methylcyclopentyl, 2- and 3-ethylcyclopentyl, 2-, 3- and 4-methylcyclohexyl, 2-, 3- and 4-ethylcyclohexyl, 2-, 3- and 4-propylcyclohexyl, 2-, 3- and 4-isopropylcyclohexyl, 2-, 3- and 4-butylcyclohexyl, 2-, 3- and 4-sec.-butylcyclohexyl, 2-, 3- and 4-tert-butylcyclohexyl, 2-, 3- and 4-methylcycloheptyl, 2-, 3- and 4-ethylcycloheptyl, 2-, 3- and 4-propylcycloheptyl, 2-, 3- and 4-isopropylcycloheptyl, 2-, 3- and 4-butylcycloheptyl, 2-, 3- and 4-sec-butylcycloheptyl, 2-, 3- and 4-tert-butylcycloheptyl, 2-, 3-, 4- and 5-methylcyclooctyl, 2-, 3-, 4- and 5-ethylcyclooctyl, 2-, 3-, 4- and 5-propylcyclooctyl.

The above remarks regarding cycloalkyl also apply to the cycloalkyl moiety in cycloalkoxy, cycloalkylthio (=cycloalkylsulfanyl), monocycloalkylamino and dicycloalkylamino.

In the context of the present invention, the term "aryl" refers to mono- or polycyclic aromatic hydrocarbon radicals. Aryl usually is an aromatic radical having 6 to 24 carbon atoms, preferably 6 to 20 carbon atoms, especially 6 to 14 carbon atoms as ring members. Aryl is preferably phenyl, naphthyl, indenyl, fluorenyl, anthracenyl, phenanthrenyl, naphthacenyl, chrysenyl, pyrenyl, coronenyl, perylenyl, etc., and more preferably phenyl or naphthyl.

Substituted aryls may, depending on the number and size of their ring systems, have one or more (e.g. 1, 2, 3, 4, 5 or more than 5) substituents. These are preferably each independently selected from alkyl, alkoxy, alkylthio, cycloalkyl, heterocycloalkyl, aryl, hetaryl, fluorine, chlorine, bromine, hydroxyl, mercapto, cyano, nitro, nitroso, formyl, acyl, COOH, carboxylate, alkylcarbonyloxy, carbamoyl, $SO_3H$, sulfonate, sulfamino, sulfamide, amidino, $NE^5E^6$ where $E^5$ and $E^6$ are each independently hydrogen, alkyl, cycloalkyl, heterocycloalkyl, aryl or hetaryl. The alkyl, alkoxy, alkylamino, alkylthio, cycloalkyl, heterocycloalkyl, aryl and hetaryl substituents on the aryl may in turn be unsubstituted or substituted. Reference is made to the substituents mentioned above for these groups. The substituents on the aryl are preferably selected from alkyl, alkoxy, haloalkyl, haloalkoxy, aryl, fluorine, chlorine, bromine, cyano and nitro. Substituted aryl is more preferably substituted phenyl which generally bears 1, 2, 3, 4 or 5, preferably 1, 2 or 3, substituents.

Substituted aryl is preferably aryl substituted by at least one alkyl group ("alkaryl", also referred to hereinafter as alkylaryl). Alkaryl groups may, depending on the size of the aromatic ring system, have one or more (e.g. 1, 2, 3, 4, 5, 6, 7, 8, 9 or more than 9) alkyl substituents. The alkyl substituents may be unsubstituted or substituted. In this regard, reference is made to the above statements regarding unsubstituted and substituted alkyl. In a preferred embodiment, the alkaryl groups have exclusively unsubstituted alkyl substituents. Alkaryl is preferably phenyl which bears 1, 2, 3, 4 or 5, preferably 1, 2 or 3, more preferably 1 or 2, alkyl substituents.

Aryl which bears one or more radicals is, for example, 2-, 3- and 4-methylphenyl, 2,4-, 2,5-, 3,5- and 2,6-dimethylphenyl, 2,4,6-trimethylphenyl, 2-, 3- and 4-ethylphenyl, 2,4-, 2,5-, 3,5- and 2,6-diethylphenyl, 2,4,6-triethylphenyl, 2-, 3- and 4-propylphenyl, 2,4-, 2,5-, 3,5- and 2,6-dipropylphenyl, 2,4,6-tripropylphenyl, 2-, 3- and 4-isopropylphenyl, 2,4-, 2,5-, 3,5- and 2,6-diisopropylphenyl, 2,4,6-triisopropylphenyl, 2-, 3- and 4-butylphenyl, 2,4-, 2,5-, 3,5- and 2,6-dibutylphenyl, 2,4,6-tributylphenyl, 2-, 3- and 4-isobutylphenyl, 2,4-, 2,5-, 3,5- and 2,6-diisobutylphenyl, 2,4,6-triisobutylphenyl, 2-, 3- and 4-sec-butylphenyl, 2,4-, 2,5-, 3,5- and 2,6-di-sec-butylphenyl, 2,4,6-tri-sec-butylphenyl, 2-, 3- and 4-tert-butylphenyl, 2,4-, 2,5-, 3,5- and 2,6-di-tert-butylphenyl and 2,4,6-tri-tert-butylphenyl; 2-, 3- and 4-methoxyphenyl, 2,4-, 2,5-, 3,5- and 2,6-dimethoxyphenyl, 2,4,6-trimethoxyphenyl, 2-, 3- and 4-ethoxyphenyl, 2,4-, 2,5-, 3,5- and 2,6-diethoxyphenyl, 2,4,6-triethoxyphenyl, 2-, 3- and 4-propoxyphenyl, 2,4-, 2,5-, 3,5- and 2,6-dipropoxyphenyl, 2-, 3- and 4-isopropoxyphenyl, 2,4-, 2,5-, 3,5- and 2,6-diisopropoxyphenyl and 2-, 3- and 4-butoxyphenyl; 2-, 3- and 4-chlorophenyl, (2-chloro-6-methyl)phenyl, (2-chloro-6-ethyl)phenyl, (4-chloro-6-methyl)phenyl, (4-chloro-6-ethyl)phenyl.

The above remarks regarding aryl also apply to the aryl moiety in aryloxy, arylthio (=arylsulfanyl), monoarylamino and diarylamino.

In the context of the present invention, the expression "heterocycloalkyl" comprises nonaromatic, unsaturated or fully saturated, cycloaliphatic groups having generally 5 to 8 ring atoms, preferably 5 or 6 ring atoms. In the heterocycloalkyl groups, compared to the corresponding cycloalkyl groups, 1, 2, 3, 4 or more than 4 of the ring carbon atoms are replaced by heteroatoms or heteroatom-containing groups. The heteroatoms or heteroatom-containing groups are preferably selected from —O—, —S—, —NR$^e$—, —C(=O)—, —S(=O)— and/or —S(=O)$_2$—. R$^e$ is preferably hydrogen, alkyl, cycloalkyl, heterocycloalkyl, aryl or hetaryl. Heterocycloalkyl is unsubstituted or optionally bears one or more, e.g. 1, 2, 3, 4, 5, 6 or 7, identical or different radicals. These are preferably each independently selected from alkyl, alkoxy, alkylamino, alkylthio, cycloalkyl, heterocycloalkyl, aryl, hetaryl, fluorine, chlorine, bromine, hydroxyl, mercapto, cyano, nitro, nitroso, formyl, acyl, COOH, carboxylate, alkylcarbonyloxy, carbamoyl, SO$_3$H, sulfonate, sulfamino, sulfamide, amidino, NE$^5$E$^6$ where E$^5$ and E$^6$ are each independently hydrogen, alkyl, cycloalkyl, heterocycloalkyl, aryl or hetaryl. Examples of heterocycloalkyl groups are especially pyrrolidinyl, piperidinyl, 2,2,6,6-tetramethylpiperidinyl, imidazolidinyl, pyrazolidinyl, oxazolidinyl, morpholinyl, thiazolidinyl, isothiazolidinyl, isoxazolidinyl, piperazinyl, tetrahydrothiophenyl, dihydrothien-2-yl, tetrahydrofuranyl, dihydrofuran-2-yl, tetrahydropyranyl, 2-oxazolinyl, 3-oxazolinyl, 4-oxazolinyl and dioxanyl.

Substituted heterocycloalkyl groups may, depending on the ring size, have one or more (e.g. 1, 2, 3, 4, 5 or more than 5) substituents. These are preferably each independently selected from alkyl, alkoxy, alkylthio, cycloalkyl, heterocycloalkyl, aryl, hetaryl, fluorine, chlorine, bromine, hydroxyl, mercapto, cyano, nitro, nitroso, formyl, acyl, COOH, carboxylate, alkylcarbonyloxy, carbamoyl, SO$_3$H, sulfonate, sulfamino, sulfamide, amidino, NE$^7$E$^8$ where E$^7$ and E$^8$ are each independently hydrogen, alkyl, cycloalkyl, heterocycloalkyl, aryl or hetaryl. In the case of substitution, the heterocycloalkyl groups preferably bear one or more, for example one, two, three, four or five, C$_1$-C$_6$-alkyl groups.

The above remarks regarding heterocycloalkyl also apply to the heterocycloalkyl moiety in heterocycloalkoxy, heterocycloalkylthio (=heterocycloalkylsulfanyl), monoheterocycloalkylamino and diheterocycloalkylamino.

In the context of the present invention, the expression "hetaryl" (heteroaryl) comprises heteroaromatic, mono- or polycyclic groups. In addition to the ring carbon atoms, these have 1, 2, 3, 4 or more than 4 heteroatoms as ring members. The heteroatoms are preferably selected from oxygen, nitrogen, selenium and sulfur. The hetaryl groups have preferably 5 to 18, e.g. 5, 6, 8, 9, 10, 11, 12, 13 or 14, ring atoms.

Monocyclic hetaryl groups are preferably 5- or 6-membered hetaryl groups, such as 2-furyl (furan-2-yl), 3-furyl (furan-3-yl), 2-thienyl (thiophen-2-yl), 3-thienyl (thiophen-3-yl), selenophen-2-yl, selenophen-3-yl, 1H-pyrrol-2-yl, 1H-pyrrol-3-yl, pyrrol-1-yl, imidazol-2-yl, imidazol-1-yl, imidazol-4-yl, pyrazol-1-yl, pyrazol-3-yl, pyrazol-4-yl, pyrazol-5-yl, 3-isoxazolyl, 4-isoxazolyl, 5-isoxazolyl, 3-isothiazolyl, 4-isothiazolyl, 5-isothiazolyl, 2-oxazolyl, 4-oxazolyl, 5-oxazolyl, 2-thiazolyl, 4-thiazolyl, 5-thiazolyl, 1,2,4-oxadiazol-3-yl, 1,2,4-oxadiazol-5-yl, 1,3,4-oxadiazol-2-yl, 1,2,4-thiadiazol-3-yl, 1,2,4-thiadiazol-5-yl, 1,3,4-thiadiazol-2-yl, 4H[1,2,4]-triazol-3-yl, 1,3,4-triazol-2-yl, 1,2,3-triazol-1-yl, 1,2,4-triazol-1-yl, pyridin-2-yl, pyridin-3-yl, pyridin-4-yl, 3-pyridazinyl, 4-pyridazinyl, 2-pyrimidinyl, 4-pyrimidinyl, 5-pyrimidinyl, 2-pyrazinyl, 1,3,5-triazin-2-yl and 1,2,4-triazin-3-yl.

Polycyclic hetaryl groups have 2, 3, 4 or more than 4 fused rings. The fused-on rings may be aromatic, saturated or partly unsaturated. Examples of polycyclic hetaryl groups are quinolinyl, isoquinolinyl, indolyl, isoindolyl, indolizinyl, benzofuranyl, isobenzofuranyl, benzothiophenyl, benzoxazolyl, benzisoxazolyl, benzthiazolyl, benzoxadiazolyl, benzothiadiazolyl, benzoxazinyl, benzopyrazolyl, benzimidazolyl, benzotriazolyl, benzotriazinyl, benzoselenophenyl, thienothiophenyl, thienopyrimidyl, thiazolothiazolyl, dibenzopyrrolyl (carbazolyl), dibenzofuranyl, dibenzothiophenyl, naphtho[2,3-b]thiophenyl, naphtha[2,3-b]furyl, dihydroindolyl, dihydroindolizinyl, dihydroisoindolyl, dihydroquinolinyl and dihydroisoquinolinyl.

Substituted hetaryl groups may, depending on the number and size of their ring systems, have one or more (e.g. 1, 2, 3, 4, 5 or more than 5) substituents. These are preferably each independently selected from alkyl, alkoxy, alkylthio, cycloalkyl, heterocycloalkyl, aryl, hetaryl, fluorine, chlorine, bromine, hydroxyl, mercapto, cyano, nitro, nitroso, formyl, acyl, COOH, carboxylate, alkylcarbonyloxy, carbamoyl, SO$_3$H, sulfonate, sulfamino, sulfamide, amidino, NE$^9$E$^{10}$ where E$^9$ and E$^{10}$ are each independently hydrogen, alkyl, cycloalkyl, heterocycloalkyl, aryl or hetaryl. Halogen substituents are preferably fluorine, chlorine or bromine. The substituents are preferably selected from C$_1$-C$_6$-alkyl, C$_1$-C$_6$-alkoxy, hydroxyl, carboxyl, halogen and cyano.

The above remarks regarding hetaryl also apply to the hetaryl moiety in hetaryloxy, hetarylthio, monohetarylamino and dihetarylamino.

For the purposes of the present invention, the expression "acyl" refers to alkanoyl or aroyl groups which generally have from 2 to 11, preferably from 2 to 8, carbon atoms, for example the acetyl, propanoyl, butanoyl, pentanoyl, hexanoyl, heptanoyl-, 2-ethyl-hexanoyl, 2-propylheptanoyl, pivaloyl, benzoyl or naphthoyl group.

The groups NE$^1$E$^2$, NE$^3$E$^4$, NE$^5$E$^6$, NE$^7$E$^8$ and NE$^9$E$^{10}$ are preferably N,N-dimethylamino, N,N-diethylamino, N,N-dipropylamino, N,N-diisopropylamino, N,N-di-n-butylamino, N,N-di-t-butylamino, N,N-dicyclohexylamino or N,N-diphenylamino.

Suitable organic semiconductor materials for the method of the invention are selected from known n-type semiconductor materials and p-type semiconductor materials.

Preferred organic semiconductor materials are selected from the following classes:
rylene diimides and naphthalene diimides,
tetraazaperopyrene,
diketopyrrolopyrroles,
fullerenes and fullerene derivatives,
thiophene compounds,
aromatic compounds with at least one condensed thiophene unit,
acenes,
spiro compounds,
metal complexes, organo-silicon and organophosphorus compounds, preferably in the form of self-assembled monolayers. Suitable are those mentioned below.

Angew. Chem. 2012, 124, 2060-2109 gives an overview of low-molecular organic semiconductors.

Rylenes and Naphthalimides

In a preferred embodiment the organic semiconductor material is selected from naphthalenetetracarboxylic acid derivates as disclosed in WO 2007/074137 A1.

In a preferred embodiment the organic semiconductor material is selected from halogenated perylene bisimide derivatives described by R. Schmidt, J. H. Oh, Y.-S. Sun, M. Deppisch, A.-M. Krause, K. Radacki, H. Braunschweig, M. Könemann, P. Erk, Z. Bao and F. Würthner in *J. Am. Chem. Soc.* 2009, 131, 6215-6228.

In a preferred embodiment the organic semiconductor material is selected from perylenediimides as described in WO 2007/093643 and WO 2007/116001.

Tetraazaperopyrene

In a preferred embodiment the organic semiconductor material is selected from tetraazaperopyrenes (TAPP) as described in Chem. Eur. J. 2007 (13), 7317 and JOC (76), 609-617. Preferred are tetraazapyrene compounds of formula I:

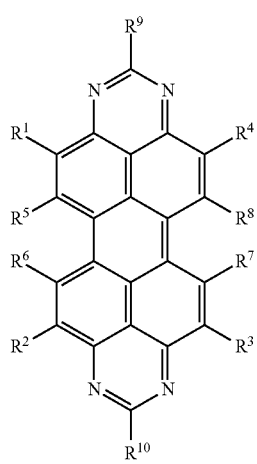

wherein
$R^1$, $R^2$, $R^3$, $R^4$, $R^5$, $R^6$, $R^7$, $R^8$ at each occurrence, independently are selected from H, Cl and Br, with the proviso that at least one of $R^1$, $R^2$, $R^3$, $R^4$, $R^5$, $R^6$, $R^7$ and $R^8$ is Cl or Br,
$R^9$, $R^{10}$, at each occurrence, independently are selected from H, a $C_{1-30}$ alkyl group, a $C_{1-30}$ haloalkyl group, a $C_{6-14}$ aryl group, a heteroaryl group having 5 to 14 ring atoms, and a $C_{7-20}$ arylalkyl group, wherein aryl, heteroaryl and arylalkyl can be optionally substituted with one or more halogen, $C_{1-4}$ haloalkyl, —CN, —NO$_2$, —CHO, —COOH, —CONH$_2$, —CO($C_{1-14}$ alkyl), —COO($C_{1-14}$ alkyl), —CONHC($C_{1-14}$ alkyl) and —CON($C_{1-14}$ alkyl)$_2$ groups.

Diketopyrrolopyrroles

In a preferred embodiment the organic semiconductor material is selected from diketopyrrolopyrroles (DPP). Suitable diketopyrrolopyrroles are described inter alia in WO 2003/048268, WO 2006/061343, WO2007/003520 and US 2010/0326525.

The synthesis and characterization of bithiophene-functionalized diketopyrrolopyrroles is described by H. Bürkstümmer, A. Weissenstein, D. Bialas and F. Würthner in J. Org. Chem. 2011, 76, 2426-2432. Preferred are compounds of the formula (II)

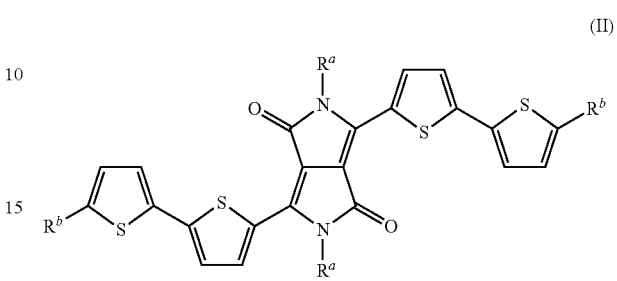

wherein
$R^a$ are independently of each other selected from hydrogen and in each case unsubstituted or substituted alkyl, cycloalkyl, heterocycloalkyl, aryl and hetaryl,
$R^b$ are independently of each other selected from hydrogen,
in each case unsubstituted or substituted alkyl, alkoxy, alkylthio, (monoalkyl)amino, (dialkyl)amino, cycloalkyl, cycloalkoxy, cycloalkylthio, (monocycloalkyl)amino, (dicycloalkyl)amino, heterocycloalkyl, heterocycloalkoxy, heterocycloalkylthio, (monoheterocycloalkyl)amino, (diheterocycloalkyl)amino, aryl, aryloxy, arylthio, (monoaryl)amino, (diaryl)amino, hetaryl, hetaryloxy, hetarylthio, (monohetaryl)amino, (dihetaryl)amino,
halogen, hydroxy, mercapto, cyano, nitro, cyanato, thiocyanato, formyl, acyl, carboxy, carboxylate, alkylcarbonyloxy, carbamoyl, alkylaminocarbonyl, dialkylaminocarbonyl, sulfo, sulfonate, sulfoamino, sulfamoyl, alkylsulfonyl, arylsulfonyl, amidino, $NE^1E^2$, where $E^1$ and $E^2$ are each independently selected from hydrogen, alkyl, cycloalkyl, heterocycloalkyl, aryl or hetaryl.

Preferably, in the compounds of formula (II) at least one of the radicals $R^a$ is selected from radicals of the general formula (C)

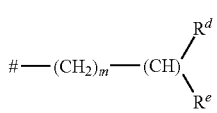

in which
# is a bonding site,
m is 0 or 1, and
$R^d$ and $R^e$ are independently selected from $C_1$- to $C_{30}$-alkyl.

Preferably, in the compounds of formula (II) the radicals $R^a$ have the same meaning.

In a first embodiment, in the formula (C) m is 0. Particularly preferred radicals of the formula (C1) are:
1-methylethyl, 1-methylpropyl, 1-methylbutyl, 1-methylpentyl, 1-methylhexyl, 1-methylheptyl, 1-methyloctyl, 1-ethylpropyl, 1-ethylbutyl, 1-ethylpentyl, 1-ethylhexyl, 1-ethylheptyl, 1-ethyloctyl, 1-propylbutyl, 1-propylpentyl, 1-propylhexyl, 1-propylheptyl, 1-propyloctyl, 1-butylpentyl, 1-butylhexyl, 1-butylheptyl, 1-butyloctyl, 1-pentylhexyl, 1-pentylheptyl, 1-pentyloctyl, 1-hexylheptyl, 1-hexyloctyl, 1-heptyloctyl.

In a second embodiment, in the formula (C) m is 1. Preferred radicals of the formula (C) wherein m is 1 are 2-ethylhexyl, 2-ethylheptyl, 2-ethyloctyl, 2-ethylnonyl and 2-ethyldecyl.

In a special embodiment the radicals $R^a$ are both 2-ethylhexyl.

Preferably, in the compounds of the formula (II), $R^b$ are independently of each other selected from hydrogen, unsubstituted alkyl, unsubstituted alkoxy, unsubstituted alkylthio, unsubstituted (monoalkyl)amino, unsubstituted (dialkyl) amino, halogen, hydroxy, cyano and $NE^1E^2$, where $E^1$ and $E^2$ are each independently selected from hydrogen and alkyl.

In a special embodiment the radicals $R^b$ are both hydrogen, methyl, ethyl, methoxy, ethoxy, methylthio, ethylthio, dimethylamino, diethylamino or cyano.

Preferred are also compounds of the formula

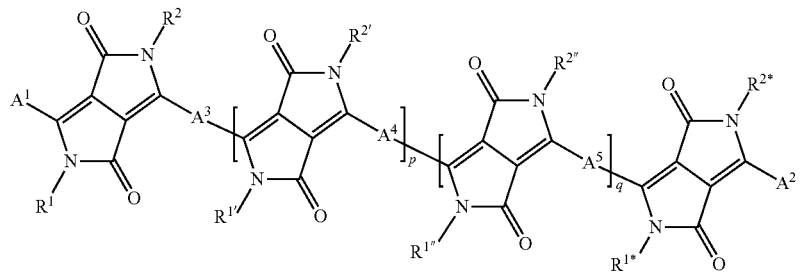

(III)

wherein p is 0, or 1, q is 0, or 1,

A1 and A2 are independently of each other a group of formula

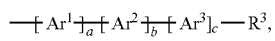

A3, A4 and A5 are independently of each other a group of formula

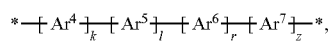

a is 1 or 2; b is 0, 1 or 2; c is 0, 1 or 2;
k is 0, 1, or 2; l is 1, 2, or 3; r is 0, or 1; z is 0, 1 or 2;
$R^1$, $R^2$, $R^{1'}$, $R^{2'}$, $R^{1''}$, $R^{2''}$, $R^{1*}$ and $R^{2*}$ may be the same or different and are selected from hydrogen, a $C_1$-$C_{100}$alkyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—, a $C_2$-$C_{100}$alkenyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—, a $C_3$-$C_{100}$alkinyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—, a $C_3$-$C_{12}$cycloalkyl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group and/or can optionally be interrupted by —O—, —S—, —$NR^{39}$—, —COO—, —CO— or —OCO—, a $C_6$-$C_{24}$aryl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, a $C_2$-$C_{20}$heteroaryl group which can optionally be substituted one or more times with $C_1$-$C_{12}$alkyl, $C_1$-$C_{12}$alkoxy, halogen, $C_5$-$C_{12}$cycloalkyl, nitro, cyano, vinyl, allyl, $C_6$-$C_{24}$aryl, $C_2$-$C_{20}$heteroaryl, a silyl group or a siloxanyl group, —CO—$C_1$-$C_{18}$alkyl, —CO—$C_5$-$C_{12}$cycloalkyl, —COO—$C_1$-$C_{18}$alkyl;

$R^3$ is hydrogen, halogen, cyano, $C_1$-$C_{25}$ alkyl, $C_1$-$C_{25}$alkyl which is substituted one or more times by E and/or interrupted one or more times by D,

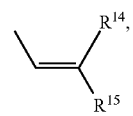

COO—$C_1$-$C_{18}$alkyl, a $C_4$-$C_{18}$cycloalkyl group, a $C_4$-$C_{18}$cycloalkyl group, which is substituted by G, $C_2$-$C_{18}$alkenyl, $C_2$-$C_{18}$alkynyl, $C_1$-$C_{18}$thioalkoxy, $C_1$-$C_{18}$alkoxy, $C_1$-$C_{18}$alkoxy which is substituted by E and/or interrupted by D, $C_7$-$C_{25}$aralkyl, or $C_7$-$C_{25}$aralkyl, which is substituted by G, or a group of formula

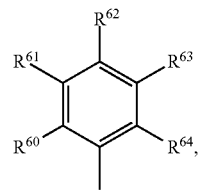 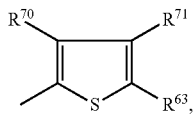

-continued
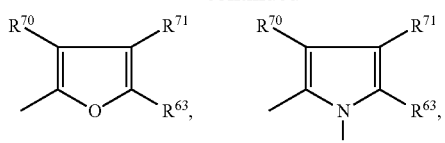
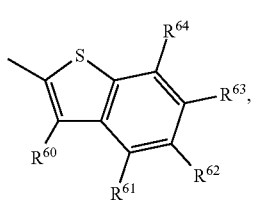
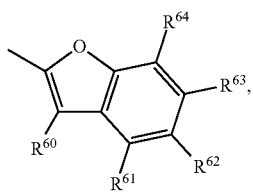
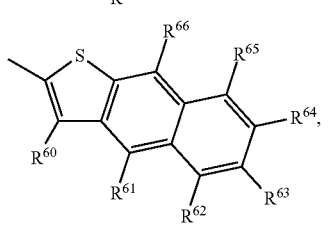
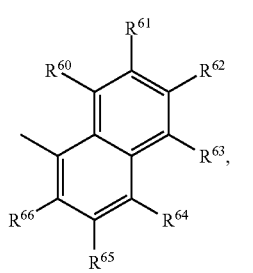
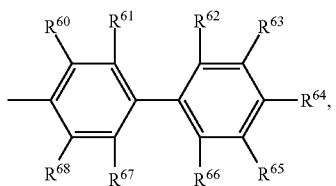
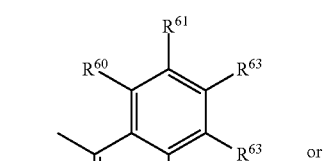
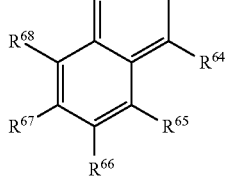
-continued
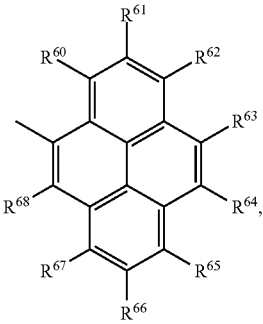
$Ar^1$, $Ar^2$, $Ar^3$, $Ar^4$, $Ar^5$, $Ar^6$ and $Ar^7$ are independently of each other a bivalent group of formula
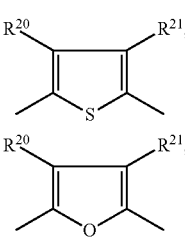 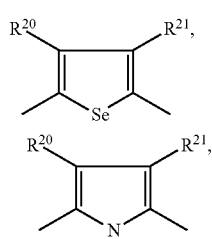
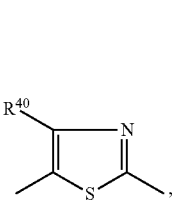 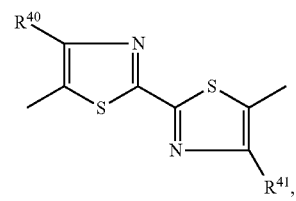
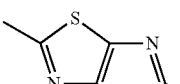 
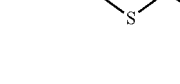 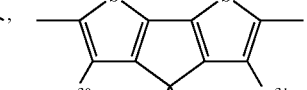
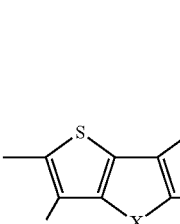 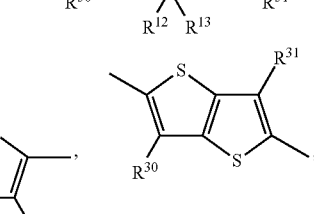
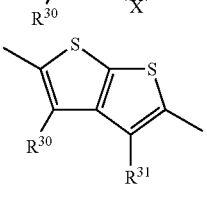 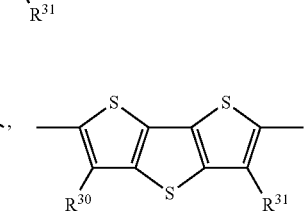
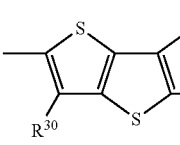 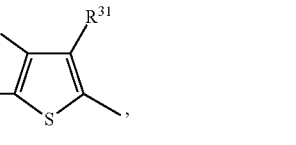

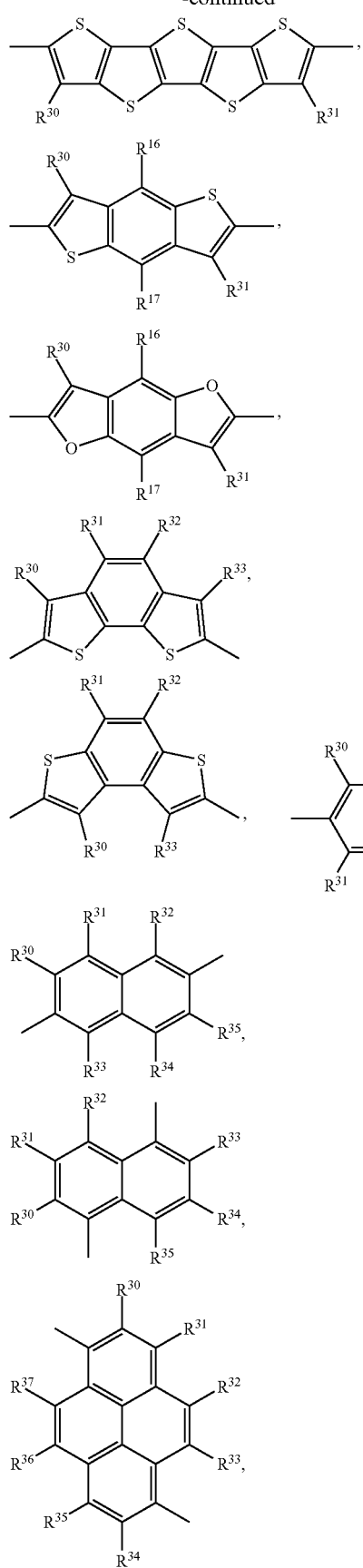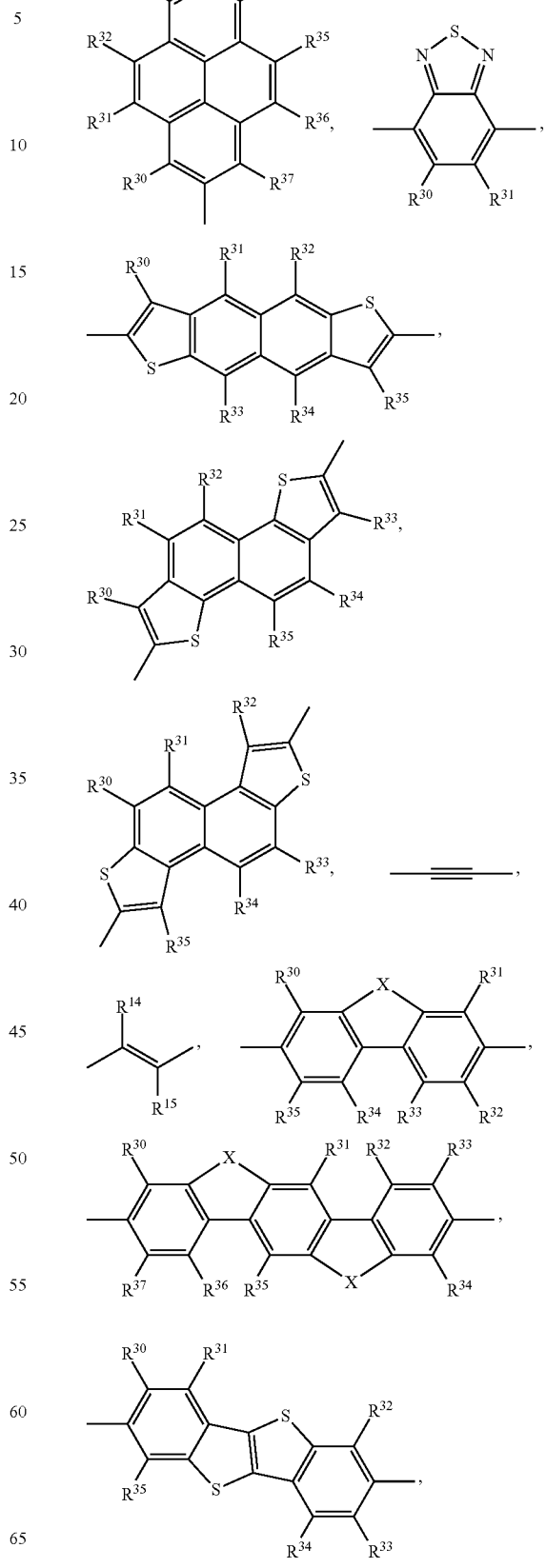

-continued

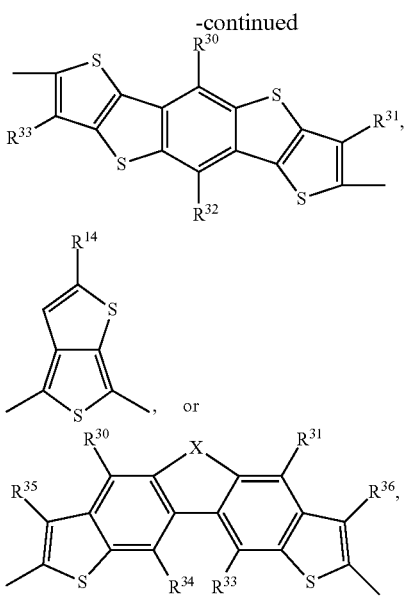

X is —O—, —S—, —NR$^{10}$—, —Si(R$^{18}$)(R$^{19}$)—, —Ge(R$^{18}$)(R$^{19}$)—, —C(R$^{12}$)(R$^{13}$)—, —C(=O)—, —C(=CR$^{14}$R$^{15}$)—

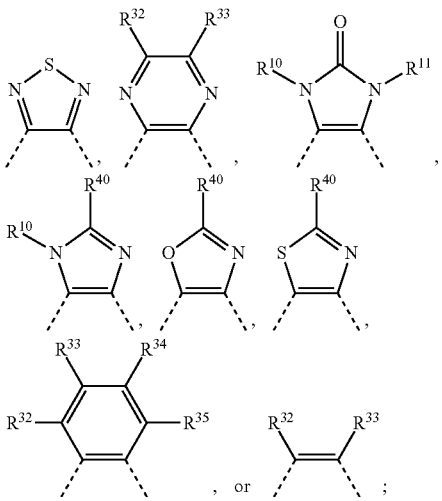

R$^{10}$ and R$^{11}$ are independently of each other hydrogen, C$_1$-C$_{18}$alkyl, C$_1$-C$_{18}$haloalkyl, C$_7$-C$_{25}$arylalkyl, C$_1$-C$_{18}$alkanoyl, R$^{12}$ and R$^{13}$ are independently of each other hydrogen, C$_1$-C$_{18}$alkyl, C$_1$-C$_{18}$haloalkyl, C$_7$-C$_{25}$arylalkyl, C$_6$-C$_{24}$aryl, C$_2$-C$_{20}$heteroaryl, or R$^{12}$ and R$^{13}$ together represent oxo,

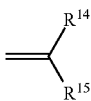

or form a five or six membered ring, which is unsubstituted or substituted by C$_1$-C$_{18}$alkyl and/or C$_1$-C$_{18}$alkoxy;

R$^{14}$ and R$^{15}$ are independently of each other hydrogen, C$_1$-C$_{18}$alkyl, C$_6$-C$_{24}$aryl, C$_2$-C$_{20}$heteroaryl, —CN or COOR$^{50}$;

R$^{16}$ and R$^{17}$ are independently of each other hydrogen, halogen, C$_1$-C$_{25}$alkyl, C$_1$-C$_{25}$alkoxy, C$_7$-C$_{25}$arylalkyl, or =R$^x$, R$^x$ is a C$_1$-C$_{12}$alkyl group, or a tri(C$_1$-C$_8$alkyl)silyl group, R$^{18}$ and R$^{19}$ are independently of each other hydrogen, C$_1$-C$_{18}$alkyl, C$_7$-C$_{25}$arylalkyl, or a phenyl group, which optionally can be substituted one to three times with C$_1$-C$_8$alkyl and/or C$_1$-C$_8$alkoxy, R$^{20}$ and R$^{21}$ are independently of each other hydrogen, C$_1$-C$_{25}$alkyl, C$_2$-C$_{25}$alkenyl, C$_2$-C$_{25}$alkyl which is interrupted by one or more —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, or R$^{20}$ and R$^{21}$ together represent alkylene or alkenylene which may be both bonded via oxygen and/or sulfur to the (hetero)aromatic residue and which may both have up to 4 carbon atoms, R$^{30}$ to R$^{38}$ are independently of each other hydrogen, C$_1$-C$_{25}$alkyl, C$_2$-C$_{25}$alkenyl, C$_2$-C$_{25}$alkyl which is interrupted by one or more —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, R$^{40}$ and R$^{41}$ are independently of each other hydrogen, C$_1$-C$_{25}$alkyl, C$_2$-C$_{25}$alkenyl, C$_2$-C$_{25}$alkyl which is interrupted by one or more —O— or —S—, COOR$^{50}$, cyano, C$_1$-C$_{18}$alkoxy, C$_6$-C$_{24}$aryl, C$_7$-C$_{25}$arylalkyl, halogen or C$_2$-C$_{20}$heteroaryl, R$^{50}$ is C$_1$-C$_{25}$alkyl, C$_1$-C$_{25}$haloalkyl, C$_7$-C$_{25}$arylalkyl, C$_6$-C$_{24}$aryl or C$_2$-C$_{20}$heteroaryl;

R$^{60}$ to R$^{68}$ represent independently of each other H, halogen, cyano, C$_1$-C$_{25}$alkyl, C$_1$-C$_{25}$alkyl which is substituted by E and/or interrupted by D, C$_6$-C$_{24}$aryl, C$_6$-C$_{24}$aryl which is substituted by G, C$_2$-C$_{20}$heteroaryl, C$_2$-C$_{20}$heteroaryl which is substituted by G, a C$_4$-C$_{18}$cycloalkyl group, a C$_4$-C$_{18}$cycloalkyl group, which is substituted by G, C$_2$-C$_{18}$alkenyl, C$_2$-C$_{18}$alkynyl, C$_1$-C$_{18}$alkoxy, C$_1$-C$_{18}$alkoxy which is substituted by E and/or interrupted by D, C$_7$-C$_{25}$aralkyl, or C$_7$-C$_{25}$aralkyl, which is substituted by G, R$^{70}$ and R$^{71}$ are independently of each other hydrogen, C$_1$-C$_{25}$alkyl, or C$_7$-C$_{25}$aralkyl, or R$^{70}$ and R$^{71}$ together represent alkylene or alkenylene which may be both bonded via oxygen and/or sulfur to the thienyl residue and which may both have up to 25 carbon atoms, D is —CO—, —COO—, —S—, —O—, —NR$^{39}$—, or —C(=O)NR$^{39}$—, E is C$_1$-C$_8$thioalkoxy, COO—C$_1$-C$_{18}$alkyl, C$_1$-C$_8$alkoxy, CN, —NR$^{39}$R$^{39'}$, —CONR$^{39}$R$^{39'}$, or halogen, G is E, or C$_1$-C$_{18}$alkyl, R$^{39}$ and R$^{39'}$ are independently of each other hydrogen, C$_1$-C$_{18}$alkyl, C$_1$-C$_{18}$haloalkyl, C$_7$-C$_{25}$arylalkyl, or C$_1$-C$_{18}$alkanoyl, with the proviso that at least one of the groups Ar$^1$, Ar$^2$, Ar$^3$, Ar$^4$, Ar$^5$, Ar$^6$ and Ar$^7$ is a group of formula

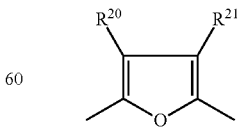

Fullerenes and Fullerene Derivatives

In a preferred embodiment the organic semiconductor material is selected from fullerenes and fullerene derivatives. Fullerenes and fullerene derivatives are preferably selected from $C_{60}$, $C_{70}$, $C_{84}$, phenyl-$C_{61}$-butyric acid methyl ester ([60]PCBM), phenyl-$C_{71}$-butyric acid methyl ester ([71]PCBM), phenyl-$C_{84}$-butyric acid methyl ester ([84]PCBM), phenyl-$C_{61}$-butyric acid butyl ester ([60]PCBB), phenyl-$C_{61}$-butyric acid octyl ester ([60]PCBO), thienyl-$C_{61}$-butyric acid methyl ester ([60]ThCBM) and mixtures thereof. Particular preference is given to $C_{60}$, [60] PCBM and mixtures thereof.

Thiophene Compounds

In a preferred embodiment the organic semiconductor material is selected from thiophene compounds. These are preferably selected from thiophenes, oligothiophenes and substituted derivatives thereof. Suitable oligothiophenes are quaterthiophenes, quinquethiophenes, sexithiophenes, α,ω-di($C_1$-$C_8$)-alkyloligothiophenes, such as α,ω-dihexylquaterthiophenes, α,ω-dihexylquinquethiophenes and α,ω-dihexylsexithiophenes, poly(alkylthiophenes) such as poly(3-hexylthiophene), bis(dithienothiophenes), anthradithiophenes and dialkylanthradithiophenes such as dihexylanthradithiophene, phenylene-thiophene (P-T) oligomers and derivatives thereof, especially α,ω-alkyl-substituted phenylene-thiophene oligomers.

Further thiophene compounds suitable as semiconductors are preferably selected from compounds like α,α'-bis(2,2-dicyanovinyl)quinquethiophene (DCV5T), (3-(4-octylphenyl)-2,2'-bithiophene) (PTOPT), and acceptor-substituted oligothiophenes as described in WO 2006/092124.

Thiophene compounds in combination with at least one compound of the formula (I) usually act as donors.

Merocyanines

In a preferred embodiment the organic semiconductor material is selected from merocyanines as described in WO 2010/049512.

Some especially preferred semiconductor materials are

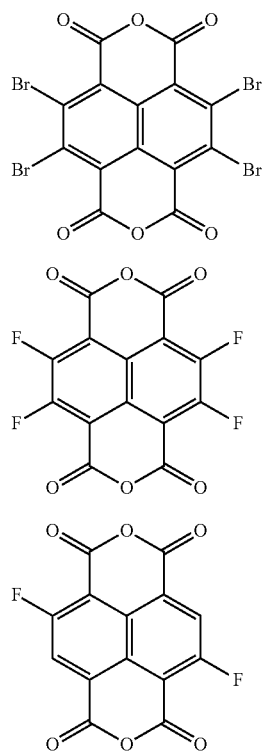

(1)

(2)

(3)

-continued

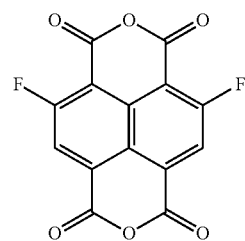

(4)

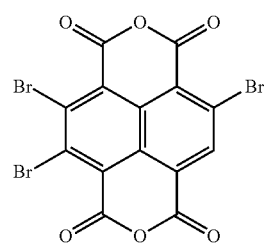

(5)

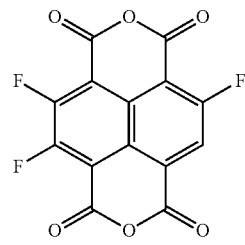

(6)

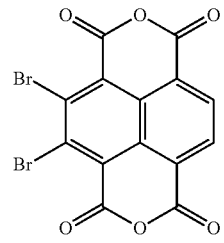

(7)

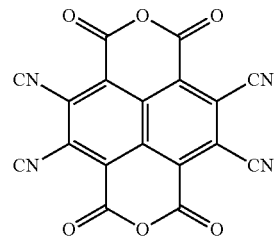

(8)

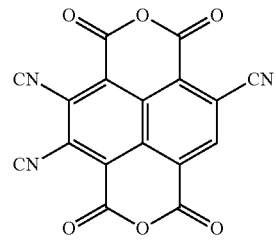

(9)

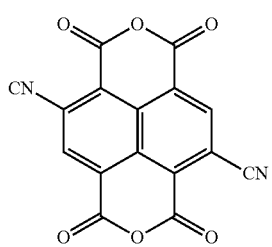
(10)
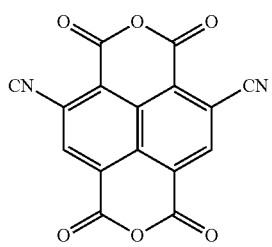
(11)
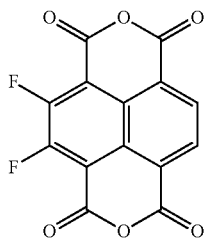
(12)
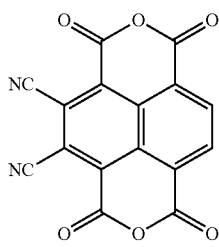
(13)
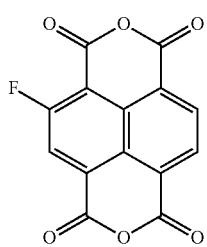
(14)
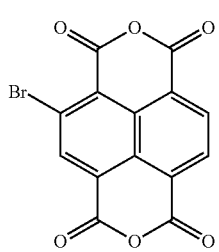
(15)
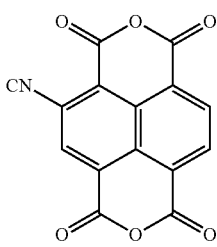
(16)
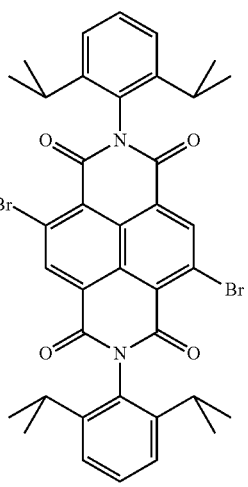
(17)
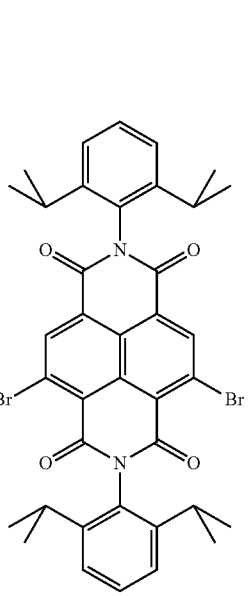
(18)

-continued
(19)
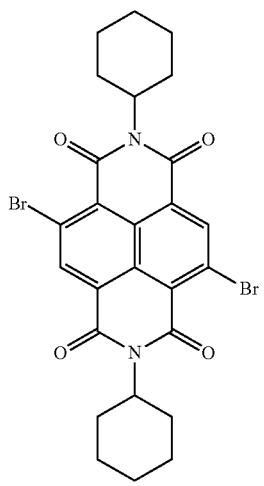
(20)
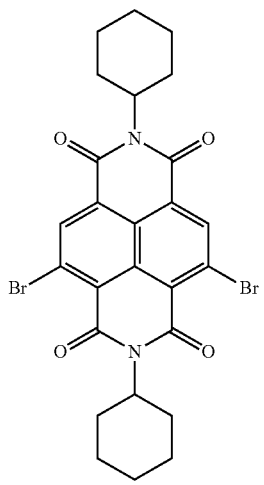
(21)
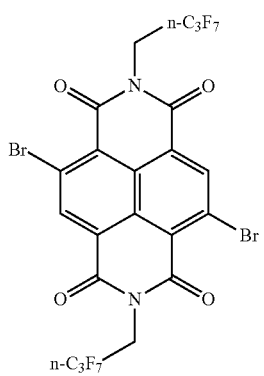
-continued
(22)
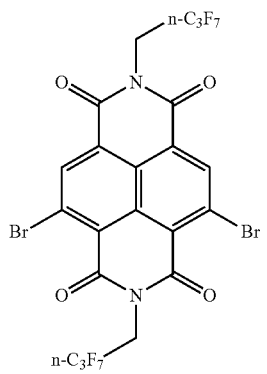
(23)
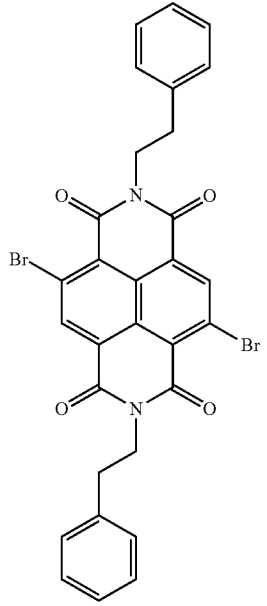
(24)
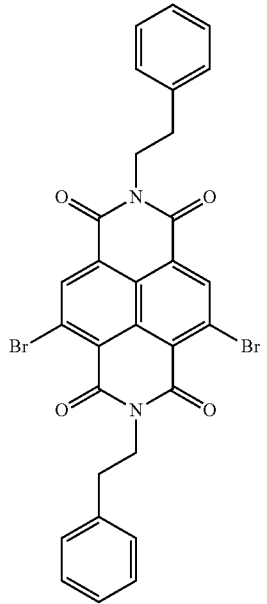

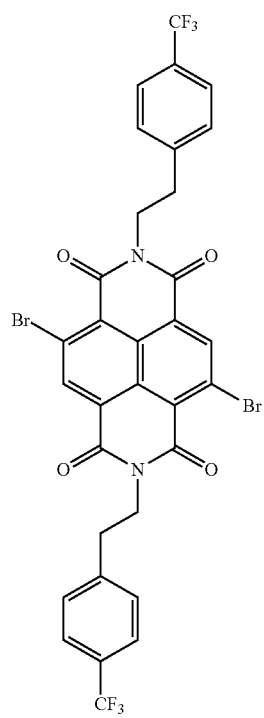
(25)
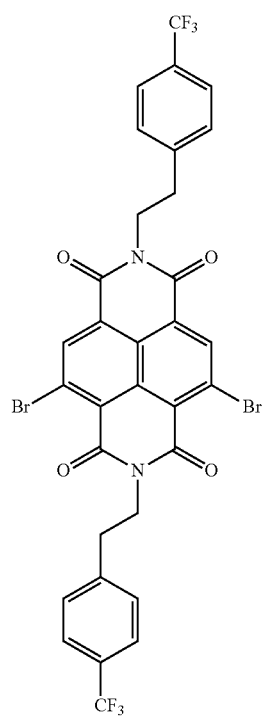
(26)
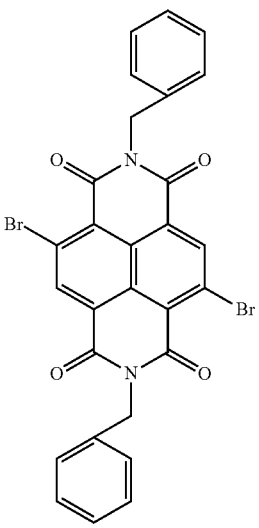
(27)
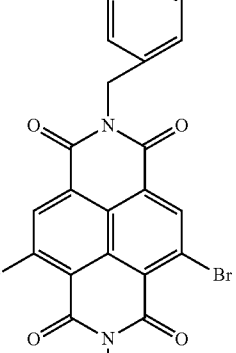
(28)
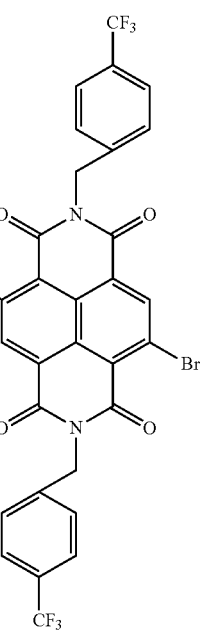
(29)

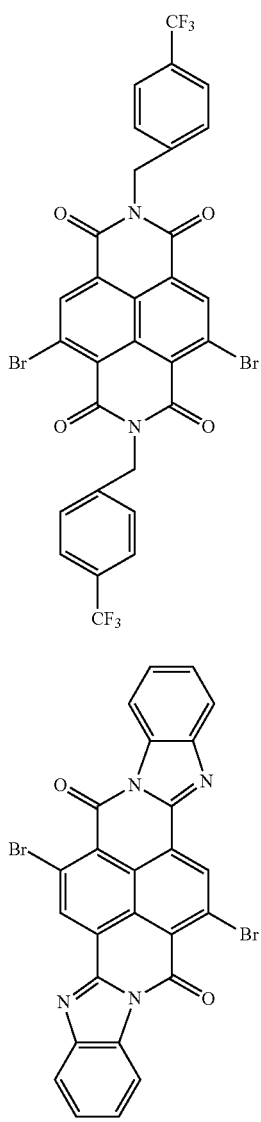
(30)
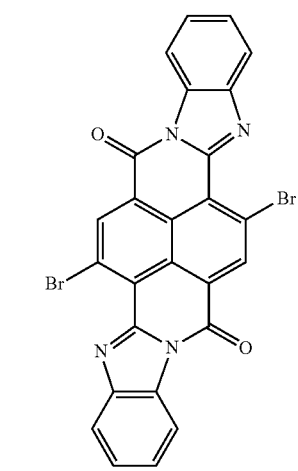
(31)
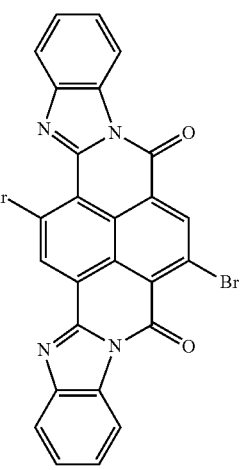
(32)
(33)
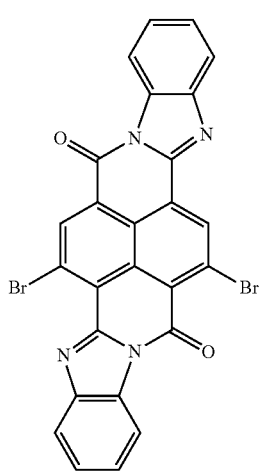
(34)
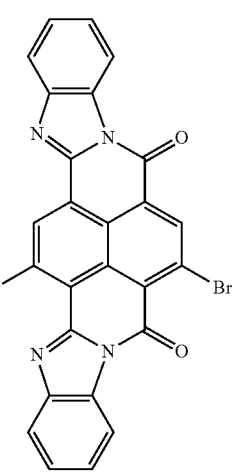
(35)

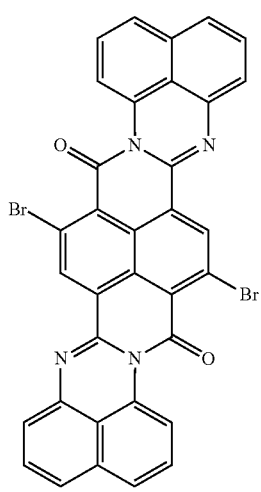
(36)
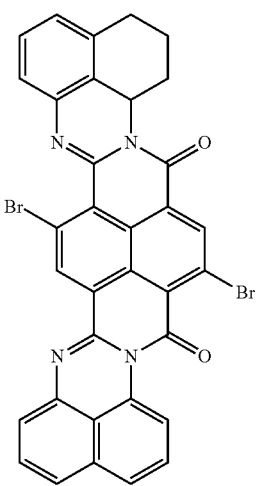
(39)
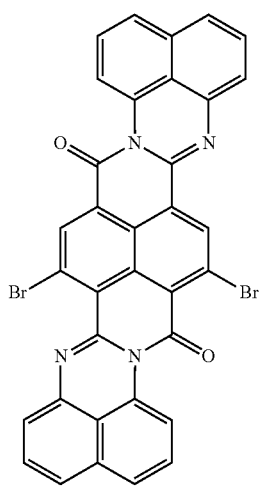
(37)
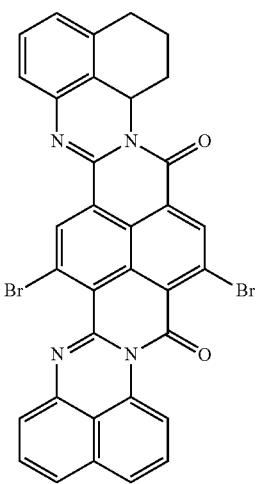
(40)
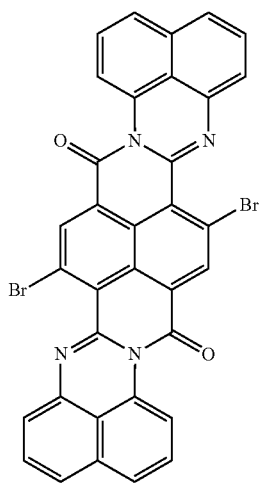
(38)
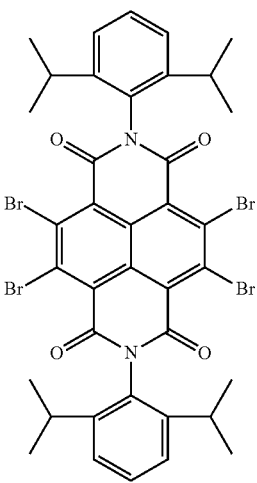
(41)

(42) 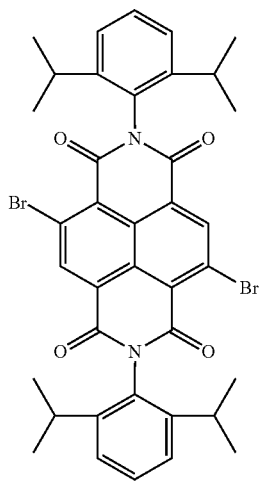
(43) 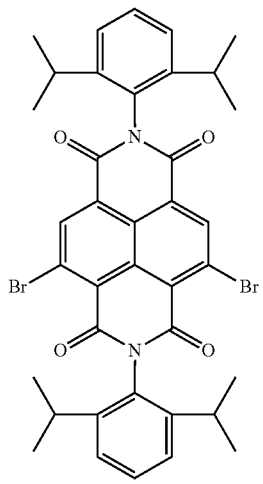
(44) 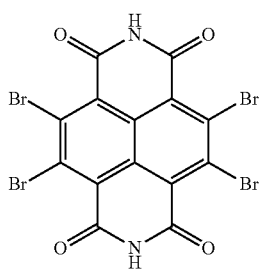
(45) 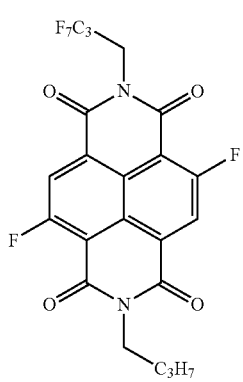
(46) 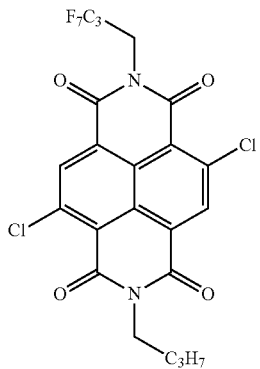
(47) 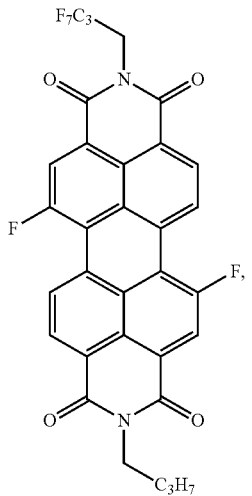
(48) 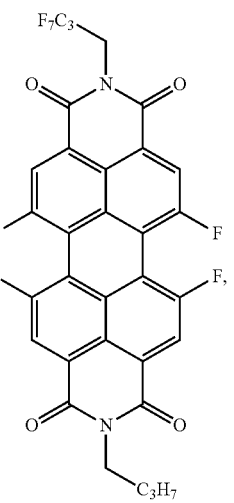

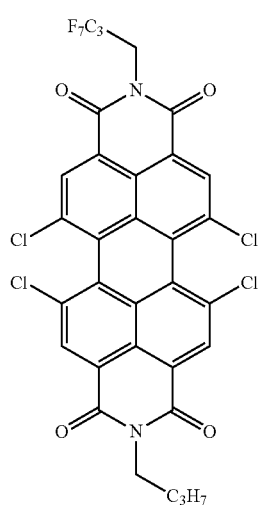
(49)
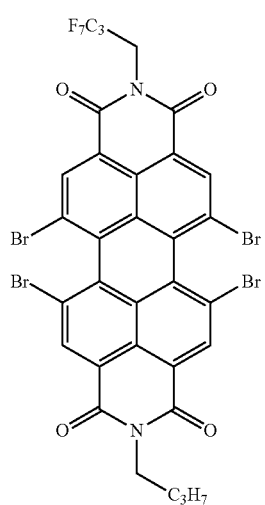
(50)
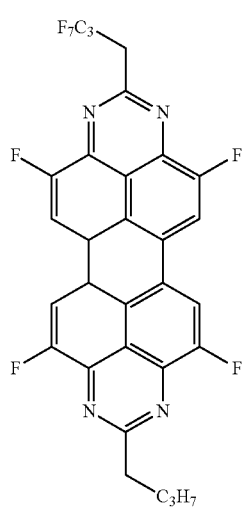
(51)
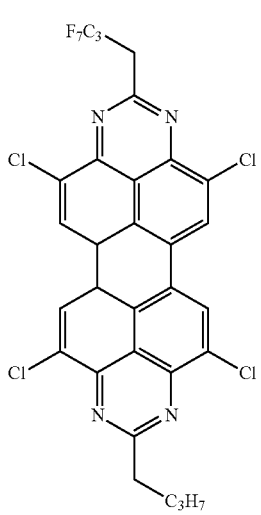
(52)
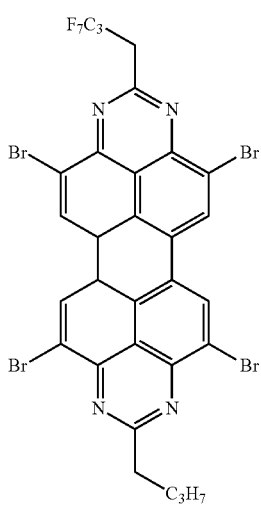
(53)
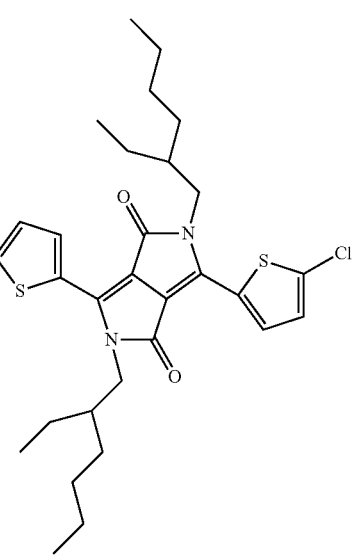
(54)
and

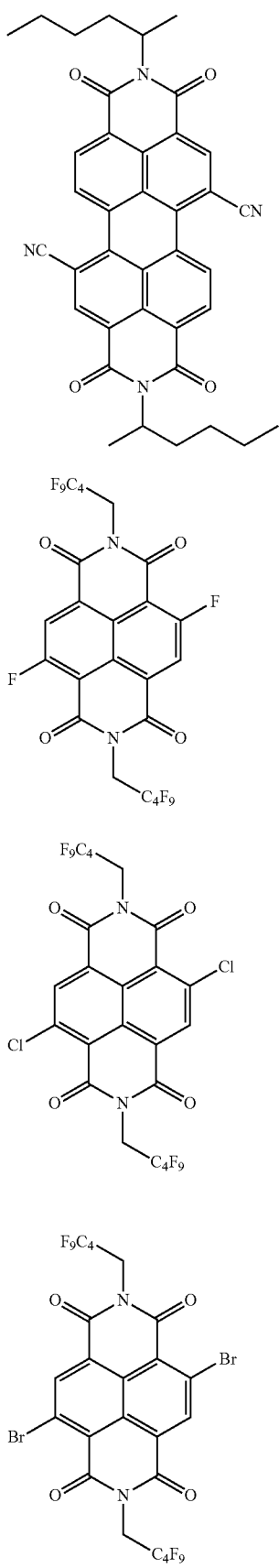

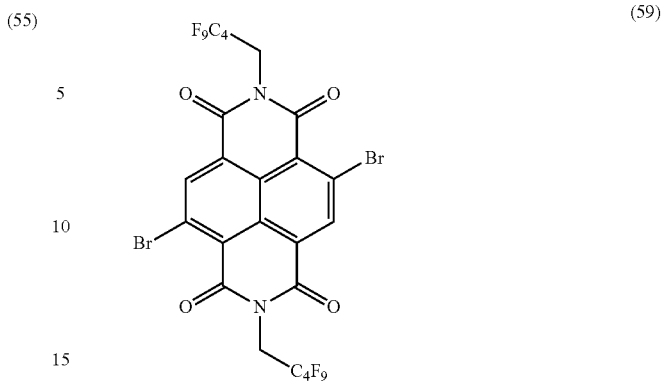

Dielectrics or Insulators

Suitable organic materials that can be employed as dielectrics are selected from polystyrene, poly-α-methylstyrene, polyolefins (such as polypropylene, polyethylene, polyisobutene), polyvinylcarbazole, fluorinated polymers (e.g. fluorinated polyimides, polytetrafluoroethylene), cyanopullulans (e.g. CYMM), polyvinylphenol, polyarylenes (e.g. poly-p-xylene), poly (arylene ethers), polyquinolines, polyvinyl chloride, etc.

Specific dielectrics are "self-assembled nanodielectrics", i.e. polymers which are obtained from monomers comprising SiCl functionalities, for example $Cl_3SiOSiCl_3$, $Cl_3Si$—$(CH_2)_6$—$SiCl_3$, $Cl_3Si$—$(CH_2)_{12}$—$SiCl_3$, and/or which are crosslinked by atmospheric moisture or by addition of water diluted with solvents (see, for example, Facchetti, Adv. Mater. 2005, 17, 1705-1725). Instead of water, it is also possible for hydroxyl-containing polymers such as polyvinylphenol or polyvinyl alcohol or copolymers of vinylphenol and styrene to serve as crosslinking components. It is also possible for at least one further polymer to be present during the crosslinking operation, for example polystyrene, which is then also crosslinked (see Facietti, US patent application 2006/0202195).

Surface Modifying Agents

In a suitable embodiment, the surface of the substrate, before the deposition of at least one organic material (in particular at least one semiconductor material), is subjected to a modification.

Preferably, this modification serves to form regions which bind the organic material and/or regions on which no organic material can be deposited. The surface of the substrate is preferably modified with at least one compound which is suitable for binding to the surface of the substrate and to the organic material that shall be deposited onto the thus modified substrate. In a suitable embodiment, a portion of the surface or the complete surface of the substrate is coated with at least one surface modifying compound in order to enable improved deposition of at least one organic material (in particular a semiconductor material).

In a preferred embodiment, the surface modifying agent is deposited on at least a part of the substrate by the deposition method according to the invention. This includes the use of mask processes to provide a desired pattern of binding sites on the surface of the substrate.

It is of course also possible to deposit the surface modifying agent on at least a part of the substrate by known processes, e.g. so-called "patterning" processes, as described, for example, in U.S. Ser. No. 11/353,934, or by self-assembly techniques that lead to so-called self assembled monolayers (SAM).

Suitable surface modifying agents are capable of a binding interaction both with the substrate and with at least one further organic material, in particular a semiconductor material. The term "binding interaction" comprises the formation of a chemical bond (covalent bond), ionic bond, coordinative interaction, van der Waals interactions, e.g. dipole-dipole interactions etc.), and combinations thereof. Suitable surface modifying agents are:

silanes, phosphonic acids, carboxylic acids, hydroxamic acids, such as alkyltrichlorosilanes, e.g. n-octadecyltrichlorosilane; compounds with trialkoxysilane groups, e.g. alkyltrialkoxysilanes such as n-octadecyltrimethoxysilane, n-octadecyltriethoxysilane, n-octadecyltri(n-propyl)oxysilane, n-octadecyltri(isopropyl)oxysilane; trialkoxyaminoalkylsilanes, such as triethoxyaminopropylsilane and N[(3-triethoxysilyl)propyl]ethylenediamine; trialkoxyalkyl 3-glycidyl ether silanes, such as triethoxypropyl 3-glycidyl ether silane; trialkoxyallylsilanes, such as allyltrimethoxysilane; trialkoxy(isocyanatoalkyl)silanes; trialkoxysilyl (meth)acryloyloxyalkanes and trialkoxysilyl(meth) acrylamidoalkanes, such as 1-triethoxysilyl-3-acryloyl-oxypropane.

amines, phosphines and sulfur-comprising compounds, especially thiols.

The surface modifying agent is preferably selected from alkyltrialkoxysilanes, especially n-octadecyltrimethoxysilane, n-octadecyltriethoxysilane; hexaalkyldisilazanes, and especially hexamethyldisilazane (HMDS); $C_8$-$C_{30}$-alkylthiols, especially hexadecanethiol; mercaptocarboxylic acids and mercaptosulfonic acids, especially mercaptoacetic acid, 3-mercaptopropionic acid, mercaptosuccinic acid, 3-mercapto-1-propanesulfonic acid and the alkali metal and ammonium salts thereof, octadecylphosphonic acid and 12,12,13,13,14,14,15,15,16,16,17,17,18,18-pentadecafluorooctadecylphosphonic acid.

Organic Materials with Exciton-Blocking Properties

Suitable organic materials with exciton-blocking properties are, for example, bathocuproin (BCP) or 4,4',4''-tris[3-methylphenyl-N-phenylamino]triphenylamine (m-MTDATA).

Organic Hole Conducting Materials

Organic materials suitable for use in a layer with hole-conducting properties are preferably selected from poly(3,4-ethylenedioxythiophene)poly(styrenesulfonate) (PEDOT-PSS), Ir-DPBIC (tris-N,N'-diphenylbenzimidazol-2-ylideneiridium(III)), N,N'-diphenyl-N,N'-bis(3-methylphenyl)-1,1'-diphenyl-4,4'-diamine (α-NPD), 2,2',7,7'-tetrakis(N,N-di-p-methoxyphenylamine)-9,9'-spirobifluorene (spiro-MeOTAD), etc. and mixtures thereof.

Organic Exciton Blocking and/or Electron Conducting Materials

Suitable organic exciton blocking and/or electron conducting materials are preferably selected from 2,9-dimethyl-4,7-diphenyl-1,10-phenanthroline (BCP), 4,7-diphenyl-1,10-phenanthroline (Bphen), 1,3-bis[2-(2,2'-bipyridin-6-yl)-1,3,4-oxadiazo-5-yl]benzene (BPY-OXD), etc.

Organic Electronic Device

The method described in the invention can be particularly used for the preparation of a layer of an organic material in organic electronic devices. There are numerous types of organic electronic devices. Common to all is the presence of one or more semiconductor materials. Organic electronic devices have been described, for example, by S. M. Sze in Physics of Organic electronic devices, $2^{nd}$ edition, John Wiley and Sons, New York (1981). Such devices include transistors (of which there are many types, including p-n-p, n-p-n, and thin-film transistors), electroluminescent devices (e.g. organic light emitting diodes (OLEDs)), photoconductors (e.g. organic solar cells), rectifiers, current limiters, thermistors, p-n junctions, field-effect diodes, Schottky diodes, and so forth. In each organic electronic device, the semiconductor material is combined with one or more metals or insulators to form the device. Organic electronic devices can be prepared or manufactured in principle by known methods such as, for example, those described by Peter Van Zant in Microchip Fabrication, Fourth Edition, McGraw-Hill, New York (2000).

In a preferred embodiment, the process according to the invention is employed for producing an organic electronic device selected from organic field-effect transistors (OFETs), organic solar cells, organic electroluminescent devices (hereinafter also abbreviated as "EL" devices) and organic Schottky diodes.

OFETs

The process of the invention is advantageously suitable for producing organic field-effect transistors. They may be used, for example, for the production of integrated circuits (ICs), for which customary n-channel MOSFETs (metal oxide semiconductor field-effect transistors) have been used to date. These are then CMOS-like semiconductor units, for example for microprocessors, microcontrollers, static RAM and other digital logic circuits. At least one of the layers of the OFET is then produced by depositing an organic material on the substrate according to the vapour phase deposition method of the invention. In addition to this vapour phase deposition at least one of the following techniques can be employed: printing (offset, flexographic, gravure, screen-printing, inkjet, electrophotography), photolithography, drop-casting, etc. The process of the invention is especially suitable for the production of displays (specifically large-surface area and/or flexible displays), RFID tags, smart labels and sensors.

A typical organic field-effect transistor comprises a substrate with at least one gate structure, a source electrode, a drain electrode, and at least one organic semiconducting material. The process of the invention is also advantageously suitable for producing substrates having a plurality of organic field-effect transistors and semiconductor units which comprise at least one such substrate.

A specific embodiment is a substrate with a pattern (topography) of organic field-effect transistors, each transistor comprising an organic semiconductor disposed on the substrate;

a gate structure for controlling the conductivity of the conductive channel; and conductive source and drain electrodes at the two ends of the channel.

In addition, the organic field-effect transistor generally comprises a dielectric.

As a buffer layer, any dielectric material is suitable, for example inorganic materials such LIF, $AlO_x$, $SiO_2$ or silicium nitride or organic materials such as polyimides or polyacrylates, e.g. polymethylmethacrylate (PMMA).

Suitable substrates of the OFETs are in principle the afore-mentioned substrates. Suitable substrates comprise, for example, metals (preferably metals of groups 8, 9, 10 or 11 of the Periodic Table, such as Au, Ag, Cu), oxidic materials (such as glass, ceramics, $SiO_2$, especially quartz), semiconductors (e.g. doped Si, doped Ge), metal alloys (for example based on Au, Ag, Cu, etc.), semiconductor alloys, polymers (e.g. polyvinyl chloride, polyolefins, such as polyethylene and polypropylene, polyesters, fluoropolymers, polyamides, polyimides, polyurethanes, polyethersulfones, polyalkyl (meth)acrylates, polystyrene and mixtures and composites thereof), inorganic solids (e.g. ammonium chloride), paper and combinations thereof. The substrates may be flexible or inflexible, and have a curved or planar geometry, depending on the desired use.

A typical substrate for semiconductor units comprises a matrix (for example a quartz or a polymer matrix) and, optionally, a dielectric top layer.

The dielectric layer can comprise at least one organic or inorganic dielectric material.

Suitable inorganic dielectric materials are e.g. strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulphide, siloxy/metal oxide hybrids. In addition, alloys, combinations, and multilayers of these can be used for the gate dielectric. A preferred inorganic dielectric material is $SiO_2$.

Suitable organic dielectric materials are those mentioned before.

The substrate may additionally have electrodes, such as gate, drain and source electrodes of OFETs, which are normally localized on the substrate (for example deposited onto or embedded into a nonconductive layer on the dielectric). The substrate may additionally comprise conductive gate electrodes of the OFETs, which are typically arranged below the dielectric top layer (i.e. the gate dielectric).

Suitable materials for source and drain electrodes are in principle electrically conductive materials. These include metals, preferably metals of groups 6, 7, 8, 9, 10 or 11 of the Periodic Table, such as Pd, Au, Ag, Cu, Al, Ni, Cr, etc. Also suitable are conductive polymers, such as PEDOT:PSS (=poly(3,4-ethylenedioxythiophene: poly(styrenesulfonate), polyaniline, surface-modified gold, etc. Preferred electrically conductive materials have a specific resistance of less than $10^{-3}$ ohm×meter, preferably less than $10^{-4}$ ohm×meter, especially less than $10^{-6}$ or $10^{-7}$ ohm×meter.

In a specific embodiment, drain and source electrodes are present at least partly on the organic semiconductor material. It will be appreciated that the substrate may comprise further components as used customarily in semiconductor materials or ICs, such as insulators, resistors, capacitors, conductor tracks, etc.

The electrodes may be applied by customary processes, such as evaporation or sputtering, lithographic processes or another structuring process, such as printing techniques.

The semiconductor materials may also be processed with suitable auxiliaries (e.g. polymers, surfactants).

In a preferred embodiment, the deposition of at least one semiconducting material is carried out by a deposition process according to the invention.

In an alternative embodiment, the deposition of at least one semiconducting material is effected by spin-coating. It is also possible to use a customary printing or coating process (inkjet, flexographic, offset, gravure; intaglio printing, nanoprinting, slot die).

The resulting semiconductor layers generally have a thickness which is sufficient for forming a semiconductor channel which is in contact with the source/drain electrodes. The organic semiconductor material is preferably deposited on the substrate in a thickness of from 10 to 1000 nm, more preferably from 15 to 250 nm. In a specific embodiment, the organic semiconductor material is deposited at least partly in crystalline form.

In a preferred embodiment, the organic field-effect transistor is a thin-film transistor (TFT). In a customary construction, a thin-film transistor has a gate electrode disposed on the substrate or buffer layer (the buffer layer being part of the substrate), a gate insulation layer disposed thereon and on the substrate, a semiconductor layer disposed on the gate insulator layer, an ohmic contact layer on the semiconductor layer, and a source electrode and a drain electrode on the ohmic contact layer.

Various semiconductor architectures are also conceivable by the process of the invention, for example top contact, top gate, bottom contact, bottom gate, or else a vertical construction, for example a VOFET (vertical organic field-effect transistor), as described, for example, in US 2004/0046182.

Preferred semiconductor architectures are the following:
1. substrate, dielectric, organic semiconductor, preferably gate, dielectric, organic semiconductor, source and drain, known as "Bottom Gate Top Contact";
2. substrate, dielectric, organic semiconductor, preferably substrate, gate, dielectric, source and drain, organic semiconductor, known as "Bottom Gate Bottom Contact";
3. substrate, organic semiconductor, dielectric, preferably substrate, source and drain, organic semiconductor, dielectric, gate, known as "Top Gate Bottom Contact";
4. substrate, organic semiconductor, dielectric, preferably substrate, organic semiconductor, source and drain, dielectric, gate, known as "Top Gate Top Contact".

The layer thicknesses are, for example, from 10 nm to 5 µm in semiconductors, from 50 nm to 10 µm in the dielectric; the electrodes may, for example, be from 20 nm to 10 µm. The OFETs may also be combined to form other components, such as ring oscillators or inverters.

A further aspect of the invention is the provision of electronic components which comprise a plurality of semiconductor components, which may be n- and/or p-semiconductors. Examples of such components are field-effect transistors (FETs), bipolar junction transistors (BJTs), tunnel diodes, converters, light-emitting components, biological and chemical detectors or sensors, temperature-dependent detectors, photodetectors, such as polarization-sensitive photodetectors, gates, AND, NAND, NOT, OR, TOR and NOR gates, registers, switches, timer units, static or dynamic stores and other dynamic or sequential, logical or other digital components including programmable switches.

A specific semiconductor element is an inverter. In digital logic, the inverter is a gate which inverts an input signal. The inverter is also referred to as a NOT gate. Real inverter switches have an output current which constitutes the opposite of the input current. Typical values are, for example, (0, +5V) for TTL switches. The performance of a digital inverter reproduces the voltage transfer curve (VTC), i.e. the plot of input current against output current. Ideally, it is a staged function and, the closer the real measured curve approximates to such a stage, the better the inverter is.

Organic Solar Cells

The process of the invention is advantageously suitable for producing organic solar cells. Preference is given to solar cells which are characterized by diffusion of excited states (exciton diffusion). In this case, one or both of the semiconductor materials utilized is notable for a diffusion of excited states (exciton mobility). Also suitable is the combination of at least one semiconductor material which is characterized by diffusion of excited states with polymers which permit conduction of the excited states along the polymer chain. In the context of the invention, such solar cells are referred to as excitonic solar cells. The direct conversion of solar energy to electrical energy in solar cells is based on the internal photo effect of a semiconductor material, i.e. the generation of electron-hole pairs by absorption of photons and the separation of the negative and positive charge carriers at a p-n transition or a Schottky contact. An exciton can form, for example, when a photon penetrates into a semiconductor and excites an electron to transfer from the valence band into the conduction band. In order to generate current, the excited state generated by the absorbed photons must, however, reach a p-n transition in order to generate a hole and an electron which then flow to the anode and cathode. The photovoltage thus generated can bring about a photocurrent in an external circuit, through which the solar cell delivers its power. The semiconductor can absorb only those photons which have an energy which is greater than its band gap. The size of the semiconductor band gap thus determines the proportion of sunlight which can be converted to electrical energy. Solar cells consist normally of two absorbing materials with different band gaps in order to very effectively utilize the solar energy.

Organic solar cells generally have a layer structure and generally comprise at least the following layers: anode, photoactive layer and cathode. These layers are generally applied to a substrate suitable for this purpose. The structure of organic solar cells is described, for example, in US 2005/0098726 and US 2005/0224905.

A typical organic solar cell comprises a substrate with at least one cathode and at least one anode, and at least one photoactive material. The organic solar cell comprises at least one photoactive region that may comprise two layers, each of which has a homogeneous composition and forms a flat donor-acceptor heterojunction. A photoactive region may also comprise a mixed layer and form a donor-acceptor heterojunction in the form of a donor-acceptor bulk heterojunction. Organic solar cells with photoactive donor-acceptor transitions in the form of a bulk heterojunction are a preferred embodiment of the invention.

Suitable substrates for organic solar cells are, for example, oxidic materials, polymers and combinations thereof. Preferred oxidic materials are selected from glass, ceramic, $SiO_2$, quartz, etc. Preferred polymers are selected from polyethylene terephthalates, polyolefins (such as polyethylene and polypropylene), polyesters, fluoropolymers, polyamides, polyurethanes, polyalkyl (meth)acrylates, polystyrenes, polyvinyl chlorides and mixtures and composites.

Suitable electrodes (cathode, anode) are in principle metals, semiconductors, metal alloys, semiconductor alloys, nanowire thereof and combinations thereof. Preferred metals are those of groups 2, 8, 9, 10, 11 or 13 of the periodic table, e.g. Pt, Au, Ag, Cu, Al, In, Mg or Ca. Preferred semiconductors are, for example, doped Si, doped Ge, indium tin oxide (ITO), fluorinated tin oxide (FTO), gallium indium tin oxide (GITO), zinc indium tin oxide (ZITO), poly(3,4-ethylenedioxythiophene) poly(styrenesulfonate) (PEDOT-PSS), etc. Preferred metal alloys are, for example, alloys based on Pt, Au, Ag, Cu, etc. A specific embodiment is Mg/Ag alloys.

The material used for the electrode facing the light (the anode in a normal structure, the cathode in an inverse structure) is preferably a material at least partly transparent to the incident light. This preferably includes electrodes which have glass and/or a transparent polymer as a carrier material. Transparent polymers suitable as carriers are those mentioned above, such as polyethylene terephthalate. The electrical contact connection is generally effected by means of metal layers and/or transparent conductive oxides (TCOs). These preferably include ITO, doped ITO, FTO (fluorine doped tin oxide), AZO (aluminum doped tin oxide), ZnO, $TiO_2$, Ag, Au, Pt. Particular preference is given to ITO for contact connection. For electrical contact connection, it is also possible to use a conductive polymer, for example a poly-3,4-alkylenedioxy-thiophene, e.g. poly-3,4-ethyleneoxythiophene poly(styrenesulfonate) (PEDOT).

The electrode facing the light is configured such that it is sufficiently thin to bring about only minimal light absorption but thick enough to enable good charge transport of the extracted charge carriers. The thickness of the electrode layer (without carrier material) is preferably within a range from 20 to 200 nm.

In a specific embodiment, the material used for the electrode facing away from the light (the cathode in a normal structure, the anode in an inverse structure) is a material which at least partly reflects the incident light. This includes metal films, preferably of Ag, Au, Al, Ca, Mg, In, and mixtures thereof. Preferred mixtures are Mg/Al. The thickness of the electrode layer is preferably within a range from 20 to 300 nm.

The photoactive region comprises or consists of at least one layer which comprises at least one organic semiconductor material as defined above. In addition, the photoactive region may have one or more further layer(s). These are, for example, selected from
- layers with electron-conducting properties (electron transport layer, ETL),
- layers which comprise a hole-conducting material (hole transport layer, HTL), which need not absorb any radiation,
- exciton- and hole-blocking layers (e.g. EBLs), which must not absorb, and
- multiplication layers.

Suitable materials for these layers are described in detail hereinafter.

Suitable exciton- and hole-blocking layers are described, for example, in U.S. Pat. No. 6,451,415. Suitable materials for exciton-blocking layers are, for example, bathocuproin (BCP), 4,4',4"-tris[3-methylphenyl-N-phenylamino]triphenylamine (m-MTDATA).

Generally, organic solar cells comprise at least one photoactive donor-acceptor heterojunction. Optical excitation of an organic material generates excitons. In order that a photocurrent occurs, the electron-hole pair has to be separated, typically at a donor-acceptor interface between two unlike contact materials. At such an interface, the donor material forms a heterojunction with an acceptor material. When the charges are not separated, they can recombine in a process also known as "quenching", either radiatively by the emission of light of a lower energy than the incident light or nonradiatively by generation of heat. Both processes are undesired.

In a first embodiment, the heterojunction has a flat configuration (see: Two layer organic photovoltaic cell, C. W. Tang, Appl. Phys. Lett., 48 (2), 183-185 (1986) or N. Karl, A. Bauer, J. Holzäpfel, J. Marktanner, M. Möbus, F. Stölzle, Mol. Cryst. Liq. Cryst., 252, 243-258 (1994).).

In a second preferred embodiment, the heterojunction is configured as a bulk (mixed) heterojunction, also referred to as an interpenetrating donor-acceptor network. Organic photovoltaic cells with a bulk heterojunction are described, for example, by C. J. Brabec, N. S. Sariciftci, J. C. Hummelen in Adv. Funct. Mater., 11 (1), 15 (2001) or by J. Xue, B. P. Rand, S. Uchida and S. R. Forrest in J. Appl. Phys. 98, 124903 (2005). Bulk heterojunctions are discussed in detail hereinafter.

The organic solar cell may have MiM, pin, pn, Mip or Min structure (M=metal, p=p-doped organic or inorganic semiconductor, n=n-doped organic or inorganic semiconductor, i=intrinsically conductive system of organic layers; see, for example, J. Drechsel et al., Org. Electron., 5 (4), 175 (2004) or Maennig et al., Appl. Phys. A 79, 1-14 (2004)).

The organic solar cell can be in the form of a in tandem cells. Suitable tandem cells are described, for example, by P. Peumans, A. Yakimov, S. R. Forrest in J. Appl. Phys., 93 (7), 3693-3723 (2003) (see also U.S. Pat. Nos. 4,461,922, 6,198,091 and 6,198,092) and are described in detail hereinafter. Suitable tandem cells can be constructed e.g. from two or more than two stacked MiM, pin, Mip or Min structures (see DE 103 13 232.5 and J. Drechsel et al., Thin Solid Films, 451452, 515-517 (2004)).

The layer thickness of the M, n, i and p layers is typically within a range from 10 to 1000 nm, more preferably from 10 to 400 nm. At least one layer of the organic solar cell is produced by the process of the invention. Further layers can also be produced by the process of the invention. Of course, it is possible that at least one layer of the organic solar cell is produced by customary processes known to those skilled in the art.

These include vapor deposition under high vacuum conditions, laser ablation or solution or dispersion processing methods such as spincoating, knifecoating, casting methods, spray application, dipcoating or printing (e.g. inkjet, flexographic, offset, gravure; intaglio, nanoimprinting). In a specific embodiment, the entire solar cell is produced by the process of the invention.

In order to improve the efficiency of organic solar cells, it is possible to shorten the mean distance through which the exciton has to diffuse in order to arrive at the next donor-acceptor interface. To this end, it is possible to use mixed layers of donor material and acceptor material which form an interpenetrating network in which internal donor-acceptor heterojunctions are possible. This bulk heterojunction is a specific form of the mixed layer, in which the excitons generated need only travel a very short distance before they arrive at a domain boundary, where they are separated.

In a preferred embodiment, the photoactive donor-acceptor transitions in the form of a bulk heterojunction are produced by a gas phase deposition process according to the invention. To this end, two complementary semiconductor materials can be subjected to a gas phase deposition according to the invention in the manner of a cosublimation. The deposition rate is preferably within a range from 0.01 to 2000 nm/s. The deposition can be effected in an inert gas atmosphere, for example under nitrogen, helium or argon. The deposition can be effected in air. The temperature of the substrate during the deposition is preferably within a range from −100 to 300° C., more preferably from −50 to 250° C.

The other layers of the organic solar cell can be produced by known processes. These include vapor deposition under high vacuum conditions, laser ablation, or solution or dispersion processing methods such as spincoating, knifecoating, casting methods, spray application, dipcoating or printing (e.g. inkjet, flexographic, offset, gravure; intaglio, nanoimprinting). In a specific embodiment, the entire solar cell is produced by the process of the invention.

The photoactive layer (homogeneous layer or mixed layer) can be subjected to a thermal treatment directly after production thereof or after production of further layers which form the solar cell. Such a heat treatment can in many cases further improve the morphology of the photoactive layer. The temperature is preferably within a range from about 60° C. to 300° C. The treatment time is preferably within a range from 1 minute to 3 hours. In addition or alternatively to a thermal treatment, the photoactive layer (mixed layer) can be subjected to a treatment with a solvent-containing gas directly after production thereof or after production of further layers which form the solar cell. In a suitable embodiment, saturated solvent vapors in air are used at ambient temperature. Suitable solvents are toluene, xylene, chloroform, N-methylpyrrolidone, dimethylformamide, ethyl acetate, chlorobenzene, dichloromethane and mixtures thereof. The treatment time is preferably within a range from 1 minute to 3 hours.

In a suitable embodiment, the organic solar cells are present as an individual cell with flat heterojunction and normal structure. In a specific embodiment, the cell has the following structure:

- an at least partly transparent conductive layer (top electrode, anode) (111)
- a hole-conducting layer (hole transport layer, HTL) (112)
- a layer which comprises a donor material (113)
- a layer which comprises an acceptor material (114)
- an exciton-blocking and/or electron-conducting layer (115)
- a second conductive layer (back electrode, cathode) (116)

The essentially transparent conductive layer (111) (anode) comprises a carrier, such as glass or a polymer (e.g. polyethylene terephthalate) and a conductive material, as described above. Examples include ITO, doped ITO, FTO, ZnO, AZO, etc. The anode material can be subjected to a surface treatment, for example with UV light, ozone, oxygen plasma, $Br_2$, etc. The layer (111) should be sufficiently thin to enable maximum light absorption, but also sufficiently thick to ensure good charge transport. The layer thickness of the transparent conductive layer (111) is preferably within a range from 20 to 200 nm.

Solar cells with normal structure optionally have a hole-conducting layer (HTL). This layer comprises at least one hole-conducting material (hole transport material, HTM). Layer (112) may be an individual layer of essentially homogeneous composition or may comprise two or more than two sublayers.

Hole-conducting materials (HTM) suitable for forming layers with hole-conducting properties (HTL) preferably comprise at least one material with high ionization energy. The ionization energy is preferably at least 5.0 eV, more preferably at least 5.5 eV. The materials may be organic or inorganic materials. Organic materials suitable for use in a layer with hole-conducting properties are preferably selected from poly(3,4-ethylenedioxythiophene) poly(styrenesulfonate) (PEDOT-PSS), Ir-DPBIC (tris-N,N'-diphenyl-benzimidazol-2-ylideneiridium(III)), N,N'-diphenyl-N,N'-bis(3-methylphenyl)-1,1-diphenyl-4,4'-diamine (α-NPD), 2,2',7,7'-tetrakis(N,N-di-p-methoxyphenylamine)-9,9'-spirobifluorene (spiro-MeOTAD), etc. and mixtures thereof. The organic materials may, if desired, be doped with a p-dopant which has a LUMO within the same range as or lower than the HOMO of the hole-conducting material. Suitable dopants are, for example, 2,3,5,6-tetrafluoro-7,7,8,8-tetracyanoquinodimethane ($F_4TCNQ$), $WO_3$, $MoO_3$, etc. Inorganic materials suitable for use in a layer with hole-conducting properties are preferably selected from $WO_3$, $MoO_3$, etc.

If present, the thickness of the layers with hole-conducting properties is preferably within a range from 5 to 200 nm, more preferably 10 to 100 nm.

Layer (113) comprises at least one organic semiconductor material. The thickness of the layer should be sufficient to absorb a maximum amount of light, but thin enough to enable effective dissipation of the charge. The thickness of the layer (113) is preferably within a range from 5 nm to 1 μm, more preferably from 5 to 100 nm.

Layer (114) comprises at least one organic semiconductor material that is complementary to the organic semiconductor material of layer (113). Thus, e.g. if layer (113) comprises at least one donor material, layer (114) comprises at least one acceptor material and vice versa. Suitable donor and acceptor materials are selected from the afore-mentioned semiconductor materials. The thickness of the layer should be sufficient to absorb a maximum amount of light, but thin enough to enable effective dissipation of the charge. The thickness of the layer (114) is preferably within a range from 5 nm to 1 µm, more preferably from 5 to 80 nm.

Solar cells with normal structure optionally comprise an exciton-blocking and/or electron-conducting layer (115) (EBL/ETL). Suitable materials for exciton-blocking layers generally have a greater band gap than the materials of layer (113) and/or (114). They are firstly capable of reflecting excitons and secondly enable good electron transport through the layer. The materials for the layer (115) may comprise organic or inorganic materials. Suitable organic materials are preferably selected from 2,9-dimethyl-4,7-diphenyl-1,10-phenanthroline (BCP), 4,7-diphenyl-1,10-phenanthroline (Bphen), 1,3-bis[2-(2,2'-bipyridin-6-yl)-1,3,4-oxadiazo-5-yl]benzene (BPY-OXD), etc. The organic materials may, if desired, be doped with an n-dopant which has a HOMO within the same range as or lower than the LUMO of the electron-conducting material. Suitable dopants are, for example, $Cs_2CO_3$, Pyronin B (PyB), Rhodamine B, cobaltocenes, etc. Inorganic materials suitable for use in a layer with electron-conducting properties are preferably selected from ZnO, etc. If present, the thickness of the layer (115) is preferably within a range from 5 to 500 nm, more preferably 10 to 100 nm.

Layer (116) is the cathode and preferably comprises at least one compound with low work function, more preferably a metal such as Ag, Al, Mg, Ca, etc. The thickness of the layer (116) is preferably within a range from about 10 nm to 10 µm, e.g. 10 nm to 60 nm.

In a further suitable embodiment, the organic solar cells are present as an individual cell with a flat heterojunction and inverse structure.

In a specific embodiment, the cell has the following structure:
- an at least partly transparent conductive layer (cathode) (111)
- an exciton-blocking and/or electron-conducting layer (112)
- a layer which comprises an acceptor material (113)
- a layer which comprises a donor material (114)
- a hole-conducting layer (hole transport layer, HTL) (115)
- a second conductive layer (back electrode, anode) (116)

With regard to suitable and preferred materials for the layers (111) to (116), reference is made to the above remarks regarding the corresponding layers in solar cells with normal structure.

In a further preferred embodiment, the organic solar cells are present as an individual cell with normal structure and have a bulk heterojunction. In a specific embodiment, the cell has the following structure:
- an at least partly transparent conductive layer (anode) (121)
- a hole-conducting layer (hole transport layer, HTL) (122)
- a mixed layer which comprises a donor material and an acceptor material, which form a donor-acceptor heterojunction in the form of a bulk heterojunction (123)
- an electron-conducting layer (124)
- an exciton-blocking and/or electron-conducting layer (125)
- a second conductive layer (back electrode, cathode) (126)

The layer (123) comprises at least two complementary organic semiconductor materials, i.e. at least one donor material and at least one acceptor material. The layer (123) comprises especially C60 or PCBM ([6,6]-phenyl-C61-butyric acid methyl ester) as an acceptor material. As described above, the layer (123) can be preferably produced by coevaporation by the method according to the invention. In an alternative embodiment, the layer (123) can be preferably produced by solution processing using customary solvents. The thickness of the layer (123) should be sufficient to absorb a maximum amount of light, but thin enough to enable effective dissipation of the charge. The thickness of the layer (123) is preferably within a range from 5 nm to 1 µm, more preferably from 5 to 200 nm, especially 5 to 80 nm.

With regard to layer (121), reference is made completely to the above remarks regarding layer (111).

With regard to layer (122), reference is made completely to the above remarks regarding layer (112).

Solar cells with a bulk heterojunction comprise an electron-conducting layer (124) (ETL). This layer comprises at least one electron transport material (ETM). Layer (124) may be a single layer of essentially homogeneous composition or may comprise two or more than two sublayers. Suitable materials for electron-conducting layers generally have a low work function or ionization energy. The ionization energy is preferably not more than 3.5 eV. Suitable organic materials are preferably selected from the aforementioned fullerenes and fullerene derivatives, 2,9-dimethyl-4,7-diphenyl-1,10-phenanthroline (BCP), 4,7-diphenyl-1,10-phenanthroline (Bphen), 1,3-bis[2-(2,2'-bipyridin-6-yl)-1,3,4-oxadiazo-5-yl]benzene (BPY-OXD), etc. The organic materials used in layer (24) may, if desired, be doped with an n-dopant which has a HOMO within the same range as or lower than the LUMO of the electron-conducting material. Suitable dopants are, for example, $Cs_2CO_3$, Pyronin B (PyB), Rhodamine B, cobaltocenes, etc. The thickness of the layer (123) is, if present, preferably within a range from 1 nm to 1 µm, particularly 5 to 60 nm.

With regard to layer (125), reference is made completely to the above remarks regarding layer (115).

With regard to layer (126), reference is made completely to the above remarks regarding layer (116).

Solar cells with a donor-acceptor heterojunction in the form of a bulk heterojunction can be produced by the gas phase deposition process of the invention as described above. With regard to deposition rates, substrate temperature during the deposition and thermal aftertreatment, reference is made to the above remarks.

In a further preferred embodiment, the inventive solar cells are present as an individual cell with inverse structure and have a bulk heterojunction.

In a particularly preferred embodiment, the inventive solar cell is a tandem cell.

A tandem cell consists of two or more than two (e.g. 3, 4, 5, etc.) subcells. A single subcell, some of the subcells or all subcells may have photoactive donor-acceptor heterojunctions. Each donor-acceptor heterojunction may be in the form of a flat heterojunction or in the form of a bulk heterojunction. Preferably, at least one of the donor-acceptor heterojunctions is in the form of a bulk heterojunction.

The subcells which form the tandem cell may be connected in parallel or in series. The subcells which form the tandem cell are preferably connected in series. There is preferably an additional recombination layer in each case between the individual subcells. The individual subcells have the same polarity, i.e. generally either only cells with normal structure or only cells with inverse structure are combined with one another.

The tandem cell preferably comprises a transparent conductive layer (layer 131). Suitable materials are those specified above for the individual cells. Layers 132 and 134 constitute subcells. "Subcell" refers here to a cell as defined above without cathode and anode. In addition, individual subcells may also be configured as dye-sensitized solar cells or polymer cells.

In all cases, preference is given to a combination of materials which exploit different regions of the spectrum of the incident light, for example of natural sunlight. Cells based on at least one perylene compound as described, for example, in European patent application WO2011158211, absorb primarily in the short-wave range. Thus, a tandem cell composed of a combination of these subcells should absorb radiation in the range from about 400 nm to 900 nm. Suitable combination of subcells should thus allow the spectral range utilized to be extended. For optimal performance properties, optical interference should be considered. For instance, subcells which absorb at relatively short wavelengths should be arranged closer to the metal top contact than subcells with longer-wave absorption.

With regard to layer (131), reference is made completely to the above remarks regarding layers (111) and (121).

With regard to layers (132) and (134), reference is made completely to the above remarks regarding layers (112) to (115) for flat heterojunctions and (122) to (125) for bulk heterojunctions.

Layer 133 is a recombination layer. Recombination layers enable the charge carriers from one subcell to recombine with those of an adjacent subcell. Small metal clusters are suitable, such as Ag, Au or combinations of highly n- and p-doped layers. In the case of metal clusters, the layer thickness is preferably within a range from 0.5 to 5 nm. In the case of highly n- and p-doped layers, the layer thickness is preferably within a range from 5 to 40 nm. The recombination layer generally connects the electron-conducting layer of a subcell to the hole-conducting layer of an adjacent subcell. In this way, further cells can be combined to form the tandem cell.

Layer 136 is the top electrode. The material depends on the polarity of the subcells. For subcells with normal structure, preference is given to using metals with a low work function, such as Ag, Al, Mg, Ca, etc. For subcells with inverse structure, preference is given to using metals with a high work function, such as Au or Pt, or PEDOT-PSS.

In the case of subcells connected in series, the overall voltage corresponds to the sum of the individual voltages of all subcells. The overall current, in contrast, is limited by the lowest current of one subcell. For this reason, the thickness of each subcell should be optimized such that all subcells have essentially the same current.

Examples of different kinds of donor-acceptor heterojunctions are a donor-acceptor double layer with a flat heterojunction, or the heterojunction is configured as a hybrid planar-mixed heterojunction or gradient bulk heterojunction or annealed bulk heterojunction.

The production of a hybrid planar-mixed heterojunction is described in Adv. Mater. 17, 66-70 (2005). In this structure, mixed heterojunction layers which were formed by simultaneous evaporation of acceptor and donor material are present between homogeneous donor and acceptor material.

In a specific embodiment of the present invention, the donor-acceptor-heterojunction is in the form of a gradient bulk heterojunction. In the mixed layers composed of donor and acceptor materials, the donor-acceptor ratio changes gradually. The form of the gradient may be stepwise or linear. In the case of a stepwise gradient, the layer 01 consists, for example, of 100% donor material, layer 02 has a donor/acceptor ratio>1, layer 03 has a donor/acceptor ratio=1, layer 04 has a donor/acceptor ratio<1, and layer 05 consists of 100% acceptor material. In the case of a linear gradient, layer 01 consists, for example, of 100% donor material, layer 02 has a decreasing ratio of donor/acceptor, i.e. the proportion of donor material decreases in a linear manner in the direction of layer 03, and layer 03 consists of 100% acceptor material. The different donor-acceptor ratios can be controlled by means of the deposition rate of each and every material. Such structures can promote the percolation path for charges.

In a further specific embodiment of the present invention, the donor-acceptor heterojunction is configured as an annealed bulk heterojunction; see, for example, Nature 425, 158-162, 2003. The process for producing such a solar cell comprises an annealing step before or after the metal deposition. As a result of the annealing, donor and acceptor materials can separate, which leads to more extended percolation paths.

Organic Electroluminescent Devices

The process of the invention is advantageously suitable for producing organic electroluminescent devices. A typical organic electroluminescent device comprises an upper electrode, a lower electrode, wherein at least one of said electrodes is transparent, an electroluminescent layer and optionally an auxiliary layer, wherein the electroluminescent arrangement comprises at least one compound of the formula I as defined above. An EL device is characterized by the fact that it emits light when an electrical voltage is applied with flow of current. Such arrangements have been known for a long time in industry and technology as light-emitting diodes (LEDs). Light is emitted on account of the fact that positive charges (holes) and negative charges (electrons) combine with the emission of light. In the sense of this application the terms electroluminescing arrangement and organic light-emitting diode (OLEDs) are used synonymously. As a rule, EL devices are constructed from several layers. At least on of those layers contains one or more organic charge transport compounds. The layer structure is in principle as follows:
1. Carrier, substrate
2. Base electrode (anode)
3. Hole-injecting layer
4. Hole-transporting layer
5. Light-emitting layer
6. Electron-transporting layer
7. Electron-injecting layer
8. Top electrode (cathode)
9. Contacts
10. Covering, encapsulation.

This structure represents the most general case and can be simplified by omitting individual layers, so that one layer performs several tasks. In the simplest case an EL arrangement consists of two electrodes between which an organic layer is arranged, which fulfils all functions, including emission of light. The structure of organic light-emitting diodes and processes for their production are known in principle to those skilled in the art, for example from WO 2005/019373. Suitable materials for the individual layers of OLEDs are disclosed, for example, in WO 00/70655. Reference is made here to the disclosure of these documents. In principle OLEDs according to the invention can be produced by methods known to those skilled in the art. In preferred embodiment, an OLED is produced by successive vapor deposition of the individual layers onto a suitable substrate, wherein at least one deposition is performed according to the method of the invention. In an alternative embodiment, at least one of the organic layers may be coated from solutions or dispersions in suitable solvents, for which coating techniques known to those skilled in the art are employed.

Suitable as substrate 1 are transparent carriers, such as glass or plastics films (for example polyesters, such as polyethylene terephthalate or polyethylene naphthalate, polycarbonate, polyacrylate, polysulphone, polyimide foil). Suitable as transparent and conducting materials are a) metal oxide, for example indium-tin oxide (ITO), tin oxide (NESA), etc. and b) semi-transparent metal films, for example Au, Pt, Ag, Cu, etc.

An organic semiconductor material preferably serves as a charge transport material (electron conductor). Thus, at least one organic semiconductor material is preferably used in a hole-injecting layer, hole transporting layer or as part of a transparent electrode.

In the EL applications according to the invention low molecular weight or oligomeric as well as polymeric materials may be used as light-emitting layer 5. The substances are characterized by the fact that they are photoluminescing. Accordingly, suitable substances are for example fluorescent dyes and fluorescent products that are forming oligomers or are incorporated into polymers. Examples of such materials are coumarins, perylenes, anthracenes, phenanthrenes, stilbenes, distyryls, methines or metal complexes such as $Alq_3$ (tris(8-hydroxyquinolinato)aluminium), etc. Suitable polymers include optionally substituted phenylenes, phenylene vinylenes or polymers with fluorescing segments in the polymer side chain or in the polymer backbone. A detailed list is given in EP-A-532 798. Preferably, in order to increase the luminance, electron-injecting or hole-injecting layers (3 and/or 7) can be incorporated into the EL arrangements. A large number of organic compounds that transport charges (holes and/or electrons) are described in the literature. Mainly low molecular weight substances are used, which are for example vacuum evaporated in a high vacuum. A comprehensive survey of the classes of substances and their use is given for example in the following publications: EP-A 387 715, U.S. Pat. Nos. 4,539,507, 4,720,432 and 4,769,292. A preferred material is PEDOT (poly-(3,4-ethylenedioxythiophene)) which can also be employed in the transparent electrode of the OLEDs.

The process of the invention allows to obtain OLEDs with high efficiency. This OLEDs can be used in all devices in which electroluminescence is useful. Suitable devices are preferably selected from stationary and mobile visual display units. Stationary visual display units are, for example, visual display units of computers, televisions, visual display units in printers, kitchen appliances and advertising panels, illuminations and information panels. Mobile visual display units are, for example, visual display units in cell phones, laptops, digital cameras, vehicles and destination displays on buses and trains. The process of the invention may also be used for producing OLEDs with inverse structure. The structure of inverse OLEDs and the materials typically used therein are known to those skilled in the art.

Organic Schottky Diodes

Organic Schottky diodes are semiconductor diodes characterized by a low forward voltage drop and a very fast switching action. Typical applications include discharge-protection for solar cells connected to lead-acid batteries and in switch mode power supplies; in both cases the low forward voltage leads to increased efficiency. A typical organic Schottky diode comprises the following layers:
  substrate
  ohmic contact
  doped buffer layer
  organic semiconductor layer
  Schottky contact.

EXAMPLES

Example 1

Preparation and Optical Characterization of an Organic Field-Effect Transistor (OFET)

An organic field-effect transistor (OFET) is a typical example of an organic electronic device where certain components of prior art inorganic semiconductor technology have been replaced by organic materials. In the case of an OFET, the channel of a conventional field effect transistor is made from a thin organic semiconducting layer. The thickness the organic semiconducting layer is typically below one micrometer. OFETs have been fabricated with various device geometries.

Preparation

Figure 1:
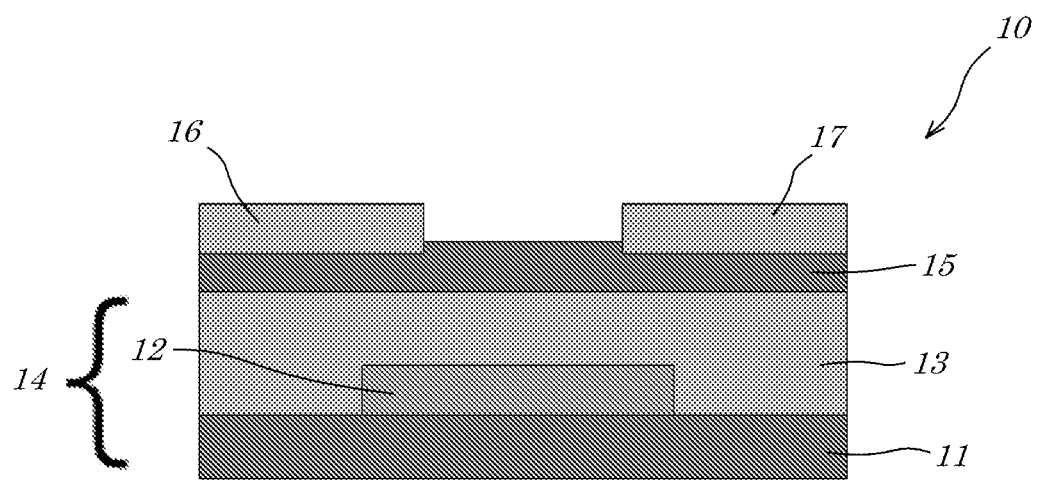
FIG. 1 shows a schematic drawing of an organic field-effect transistor (OFET) which has an organic semiconducting layer of compound (A) deposited onto a silicon/silicone dioxide substrate in accordance with the method the present invention.

A typical example is depicted in FIG. 1 where the OFET 10 comprises a silicon wafer 11 which has been provided with metal gate electrodes 12 deposited via conventional high-vacuum physical vapor deposition techniques onto the surface of the bulk silicon 11. Subsequently an insulating dielectric layer 13 of thermally oxidized silicon has been grown. In the present case the dielectric layer 13 has a thickness of 100 nm and a relative permittivity $\varepsilon_r$ of 3.9.

The silicone wafer 11 with prefabricated gate structures 12 and dielectric layer 13 represents the substrate 14 onto which a thin layer 15 of a semiconducting organic material is deposited using the method of the present invention as will be described in more detail below in connection with FIG. 2.

After deposition of the organic semiconducting layer 15, drain and source contacts 16, 17 are deposited as gold layers with a thickness of 50 nm through a shadow mask using conventional PVD techniques such as a Biorad Polaron sputter-coater operating at a deposition rate of 0.8 Å/s at a vacuum pressure of about 5×10$^{-5}$ mbar.

Figure 2:
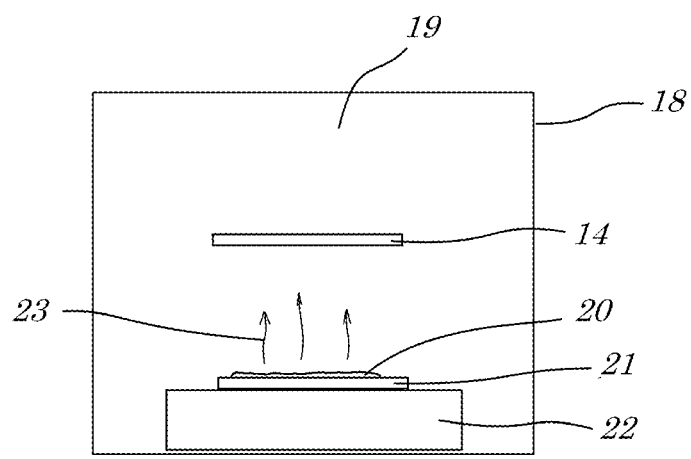
FIG. 2 shows a schematic drawing of a device for carrying out the method of the present invention.

The organic semiconducting layer 15 of the OFET 10 is prepared using a simple experimental setup as depicted FIG. 2.

A deposition chamber 18 is filled with an atmosphere 19 of ambient air at ambient pressure. A small amount of solid organic semiconducting material 20 (a few milligrams) having the following structure (A)

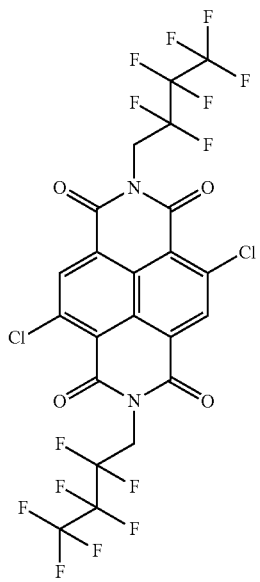 [SMILES: O=C1c2cc(Cl)c3c4c(cc(Cl)c(c24)C(=O)N1CC(F)(F)C(F)(F)C(F)(F)F)C(=O)N(CC(F)(F)C(F)(F)C(F)(F)F)C3=O]

is distributed on a silicon wafer 21 acting as a support which is then placed onto a electrically powered hot plate 22 (Stuart SD160) and heated up to a temperature of 280° C. As soon as the organic material 20 melts, it immediately begins to evaporate as could be determined by rising fog, schematically denoted by arrows 23 in FIG. 2. The silicon/silicon dioxide substrate 14 described above is heated to a temperature close to the melting temperature of the organic material 20 but in any case below the temperature of the hot plate 22 and supporting silicon wafer 21, i.e. below 280° C. and was then brought into contact with the rising fog 23 to allow the evaporated organic material to deposit onto the surface of substrate 14 in order to form a polycrystalline layer 15 on the thermally oxidized but otherwise untreated surface of the substrate 14.

Layers of different crystal structures and crystal sizes can be deposited by varying deposition conditions such as exposure time, temperature differentials and distances between source 20 and substrate 14. Depending on the thickness of the vapor-deposited layer 15, different colors of the layer can be observed.

Optical Characterization

In photographs taken by polarized light microscopy of organic layers 15 produced with the above described material (A) using the method of the invention, the organic layers exhibit different colors depending on the thickness of the material. The different morphologies observed under the polarized light microscope generally correlate with different electrical properties of the layer. It has been observed that larger the crystals are associated with the fewer grain boundaries thus leading to improved electrical properties—in particular as far as charge carrier mobility µ is concerned.

Example 2

Preparation and Electrical Characterization of Another OFET Device

An OFET was prepared and optically characterized in accordance with Example 1 but using a different organic semiconducting material, having the following structure (B):

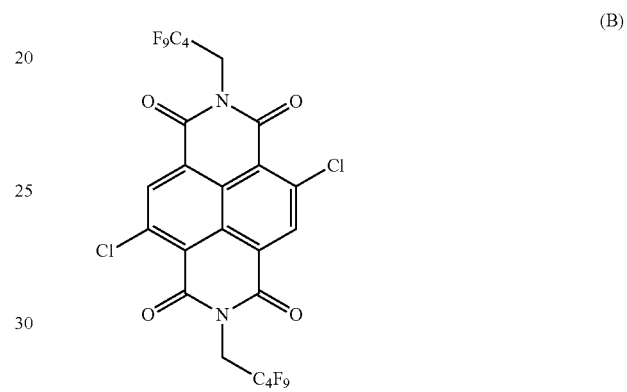

OFETs produced in accordance with Example 2 had a channel width (W) of 200 µm and channel length (L) of 100 µm and have been electrically characterized using an Agilent 4145C Semiconductor Parameter Analyzer.

Figure 3:
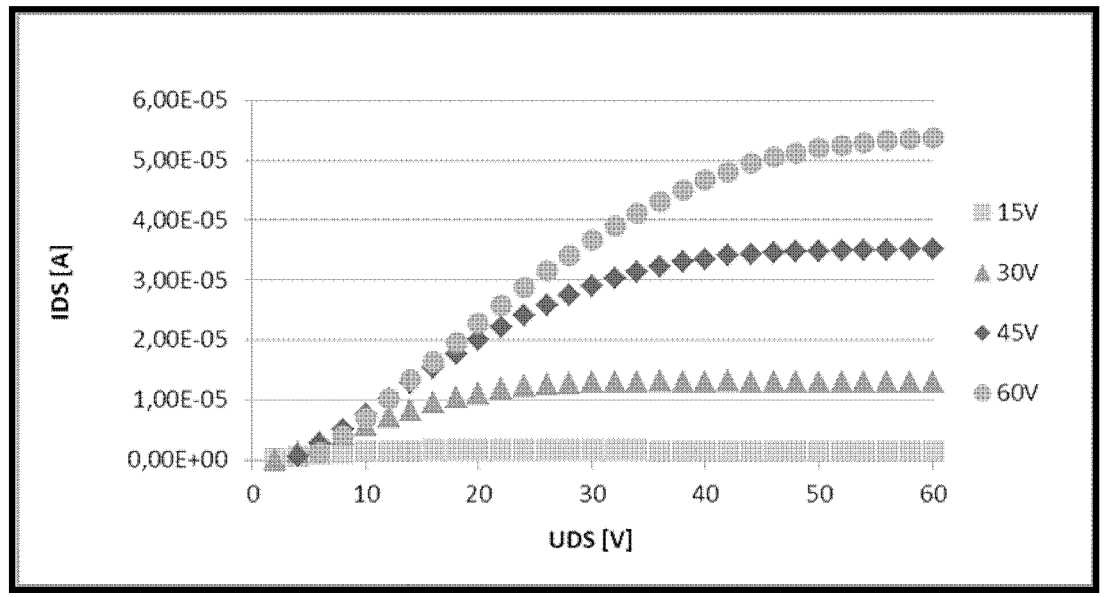
FIG. 3 is a diagram showing the output characteristics of an OFET on the basis of compound (B) prepared in accordance with the invention.
Figure 4:
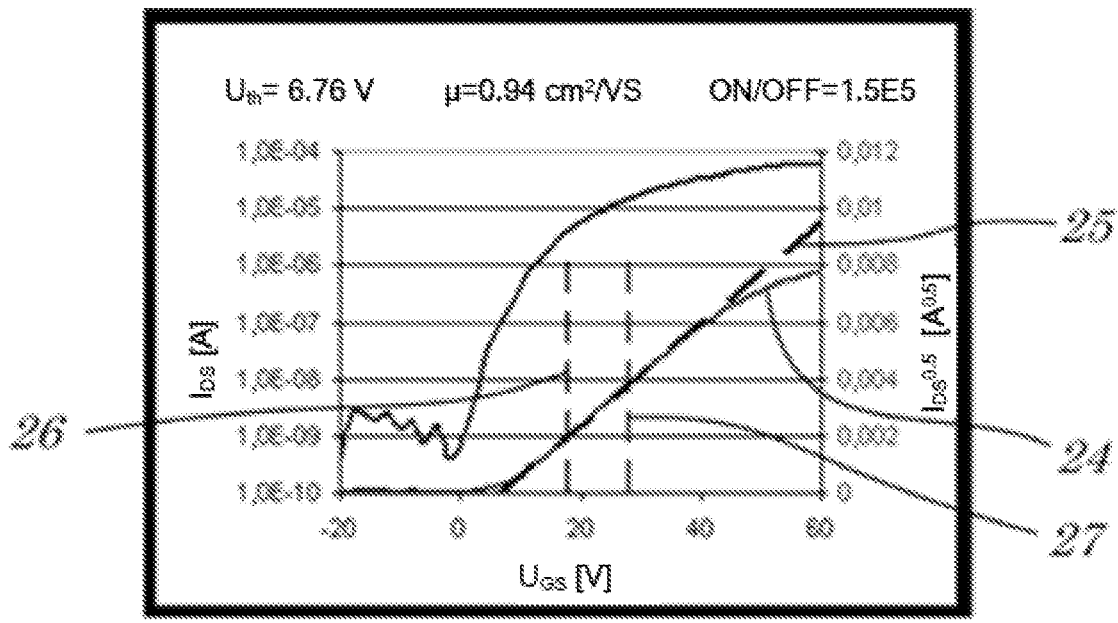
FIG. 4 is a diagram showing the transfer characteristics of the OFET of FIG. 3.

The measurement results are depicted in FIGS. 3 and 4, respectively.

FIG. 3 shows the output characteristics with $U_{DS}$=0 V to +60V at 2V step size with $U_{GS}$=15, 30, 45 and 60V.

FIG. 4 shows the transfer characteristics with $U_{GS}$=−20 V to +60 V at 2V step size with $U_{DS}$=40V The mobility µ is calculated from the root representation of the transfer characteristic curve (reference numeral 24 in FIG. 4) calculated in the saturation region. The slope m is determined from the dashed line 25. The dashed line 25 is fitted to a region of the root representation 24 of the current characteristic IDS such that a good correlation to the linear slope of the root representation is obtained (left boundary of the region is denoted by the vertical dashed line 26 and the right boundary by vertical dashed line 27).

The threshold voltage $U_{Th}$ can be taken from the intersection of dashed line 25 in FIG. 4 with the X-axis portion ($U_{GS}$).

In order to calculate the electrical properties of the OFET, the following equations are employed:

$$\mu = \frac{m^2 * 2L}{C_G * W} \quad C_G = \varepsilon_0 * \varepsilon_r \frac{1}{d} \quad U_{Th} = -1 * \frac{b}{m} \quad ON/OFF = \frac{I_{D\max}}{I_{D\min}}$$

where $\varepsilon_0$ is the vacuum permittivity of 8.85×10$^{-12}$ As/Vm.

Example 3

Electrical Characterization of an OFET Array

An organic layer of compound (B) is deposited on a wafer substrate comprising an array of 180 OFETs using the method of the present invention. In this example, the substrate is not only placed at a short distance above the heated source into the rising vapor stream but moved with constant velocity through the vapor by means of a doctor blade drawing table. This method allows to produce a very uniform and homogenous coating over a large area of the substrate surface (complete coverage of the substrate with an organic semiconducting layer having a uniform thickness). In the present example, 180 OFTs were coated and individually contacted to determine their electrical characteristics.

Figure 5:
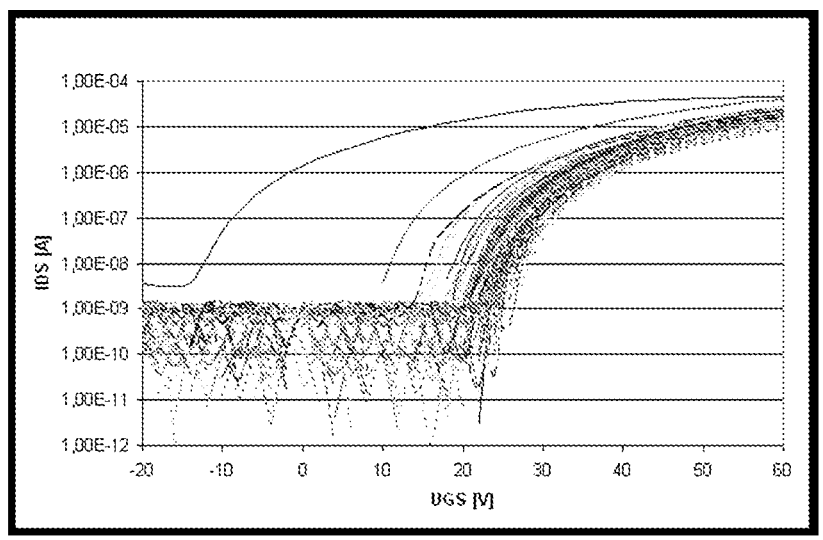
FIG. 5 is a diagram showing the transfer characteristics of an array of 180 OFETs on the basis of compound (B)

The measurements reveal a very good homogeneity of the transistors with nearly identical transfer characteristics. FIG. 5 is a diagram showing the transfer characteristics of the array of OFETs. Almost the same transfer characteristics is obtained for each OFET. As can be seen from FIG. 5, only two OFETs show a different characteristic. This difference has been attributed to the fact, that these have been the first measurements on this substrate which have been taken while traps in the dielectric were filled during first the measurements. A surface treatment with a SAM of octadecyltrichlorosilane (OTS) is resolving this matter.

Figure 6:
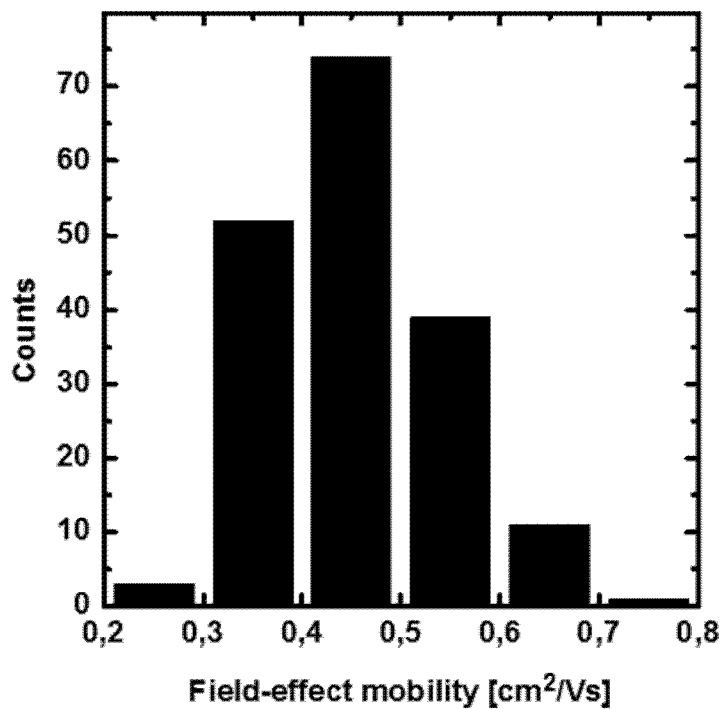
FIG. 6 is a diagram showing mobility distribution of the array of OFETs on the basis of compound (B)

FIG. 6 is a diagram showing the mobility distribution of the array of OFETs. Since mobility fluctuations in the order of a magnitude are acceptable for many applications, the variations observed in this in this example are extremely low. As a matter of fact, 91% of all transistors are in a range of from 0.3 and 0.6 cm$^2$/Vs. The best transistor showed a mobility of 0.9 cm$^2$/Vs and even the least effective transistor still showed a remarkable mobility of 0.27 cm$^2$/Vs.

Example 4

Influence of Substrate Surface Modification on Electrical Characteristics of an OFET It has been shown that by functionalizing the substrate surface, electrical properties such as the threshold voltage $U_{th}$ can be modified:

For instance, as known in the art, a silicon dioxide surface can be functionalized with octadecyltrichlorosilane (OTS). It has been found that deposition of an organic semiconducting layer onto a substrate 14 functionalized with OTS shifts the threshold voltage towards 0V.

Figure 7:
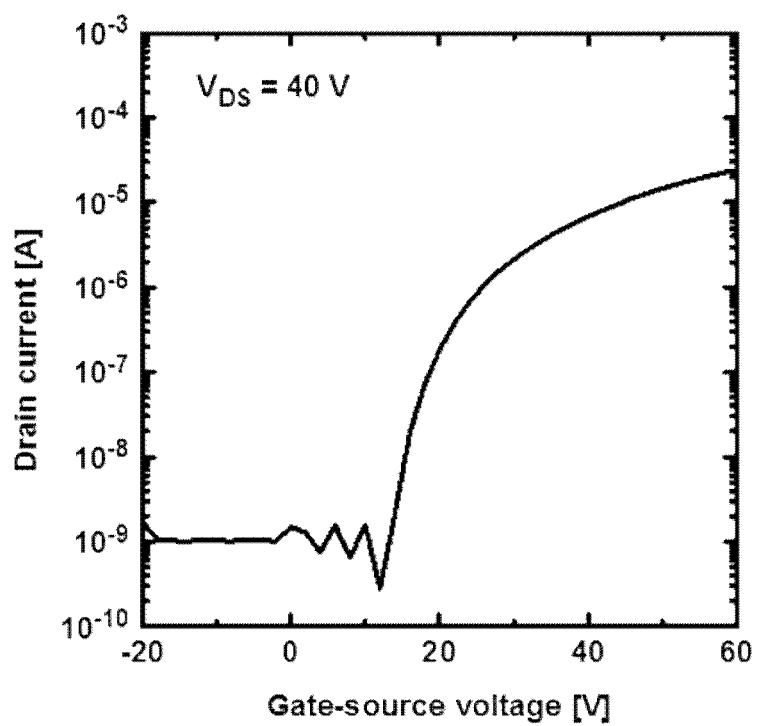
FIG. 7 is a diagram showing the transfer characteristics of an OFET where the organic layer is deposited onto an unmodified substrate.
Figure 8:
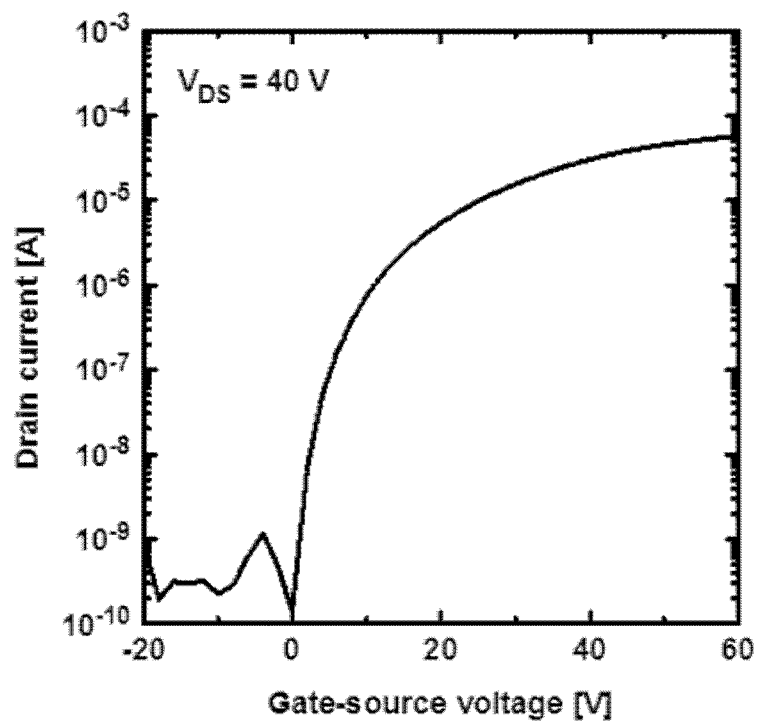
FIG. 8 is a diagram showing the transfer characteristics of an OFET where the organic layer is deposited onto a substrate modified with octadecyltrichlorosilane (OTS)
Figure 9:
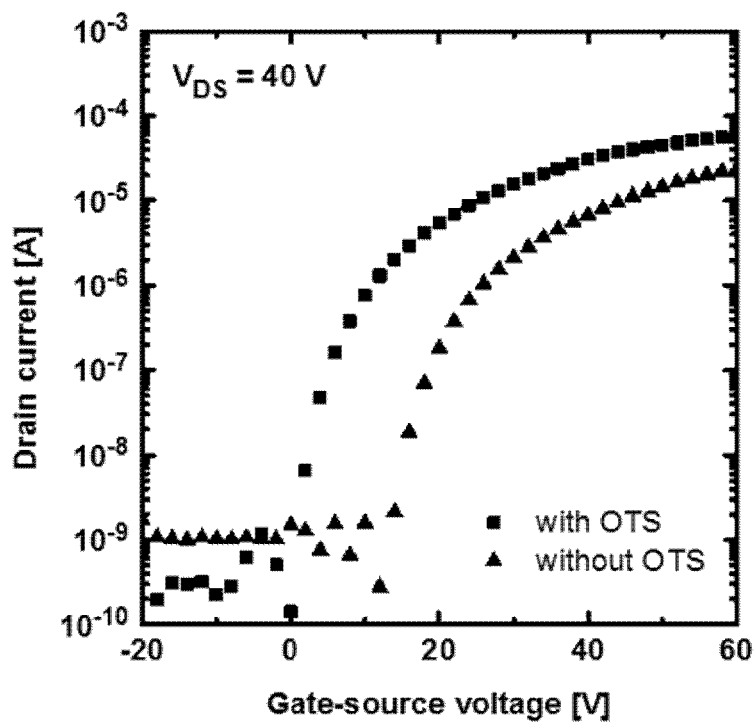
FIG. 9 is a superposition of FIGS. 7 and 8 to depict the influence of OTS

FIG. 7 is a diagram showing the transfer characteristics of an OFET where the organic layer is deposited onto an unmodified substrate at different $U_{DS}$ values. FIG. 8 is a diagram showing the transfer characteristics of an OFET where the organic layer is deposited onto a substrate modified with octadecyltrichlorosilane (OTS) at different $U_{DS}$ values. FIG. 9 is a superposition of FIGS. 7 and 8 that clearly shows the effect of the surface modification prior to the deposition of the organic semiconductor material.

From these measurements, the following statistics for the threshold voltage $U_{th}$ is obtained:

|  | without OTS $U_{th}$ [V] | with OTS $U_{th}$ [V] |
| --- | --- | --- |
| Min. | −5.05 | −3.28 |
| Max | 18.42 | 6.83 |
| Mean | 14.40 | 4.81 |
| Std.Dev. | 6.38 | 2.94 |

Example 5

Preparation and Electrical Characterization of Another OFET Device

An OFET was prepared and optically characterized in accordance with Example 1 but using a different organic semiconducting material, having the following structure (C):

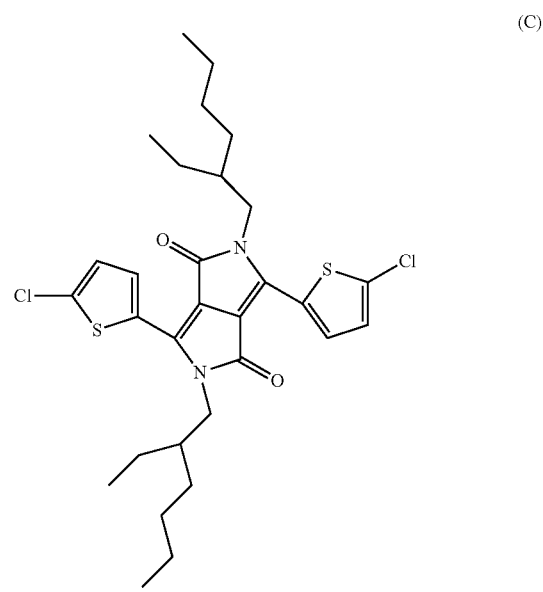 [SMILES: CCCCC(CC)CN1C(=O)C2=C(c3ccc(Cl)s3)N(CC(CC)CCCC)C(=O)C2=C1c1ccc(Cl)s1]

(C)

OFETs produced in accordance with Example 5 had a channel length (W) of 200 μm and channel width (L) of 100 μm and have been electrically characterized using an Agilent 4145C Semiconductor Parameter Analyzer.

Figure 10:
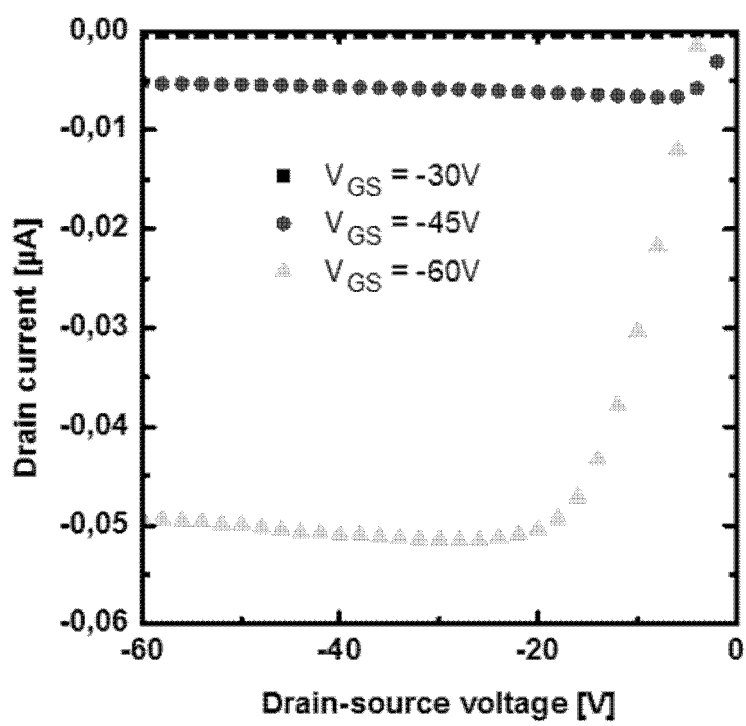
FIG. 10 is a diagram showing the output characteristics of an OFET prepared from compound (C) in accordance with the invention.
Figure 11:
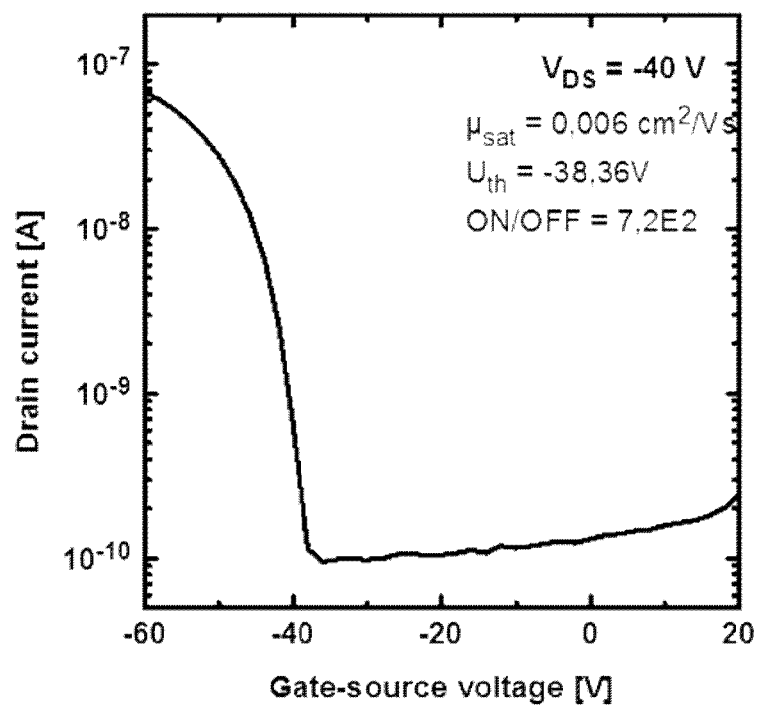
FIG. 11 is a diagram showing the transfer characteristics of the OFET of FIG. 10.

The measurement results are depicted in FIGS. 10 and 11, respectively.

FIG. 10 shows the output characteristics with $U_{DS}$=0 V to +60V at 2V step size with $U_{GS}$=0, 45 and 60V.

FIG. 11 shows the transfer characteristics with $U_{GS}$=−20 V to +60 V at 2V step size with $U_{DS}$=40V

Example 6

XRD characterization of a polycrystalline organic semiconductor layer

The following samples were prepared using the organic semiconducting material having the structure (B):

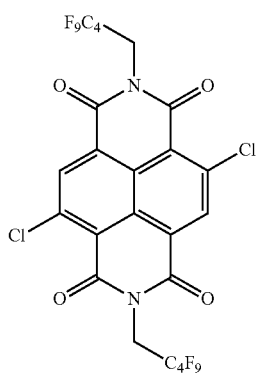

(B)

1) spincoating (comparison): A 0.5 wt. % solution of compound (B) in THF was applied to a silicon/silicon dioxide substrate by spincoating. The obtained layer had a thickness of 50 nm.
2) vacuum deposition (comparison): A 50 nm layer of compound (B) was deposited on a silicon/silicon dioxide substrate by vacuum deposition (~$10^{-6}$ mbar) at a substrate temperature of 70° C.
3) deposition at ambient pressure: A 50 nm layer of compound (B) was deposited on a silicon/silicon dioxide substrate by deposition at a source temperature of 320° C. and a substrate temperature of 190° C. The distance between source and substrate was 1-2 mm( ). The substrate is moved through the vapor of the organic material at a speed of 15.8 mm/s.

Sample 1) showed the lowest crystallite size in the XRD (18 nm) and the polarization microscope. and the worst electric properties. Sample 3) that was prepared by the method according to the invention showed the largest crystallite in the XRD (62 nm) as well as in the polarization microscope.

XRD Measurement:
X-ray powder diffraction (XRPD) using a Diffraktometer D 8 Advance Series 2 (Fa. Bruker/AXS)

| sample | mean size of the crystallites [nm] in nm |
|---|---|
| 1) | 18 |
| 2) | 23 |
| 3) | 62 |

The mean size of the crystallites was determined from the peaks at 8, 12 and 17° 2-Theta.

The relative error using single line fit is approx.+/−20%.

Crystallite Size Determination

The crystallite size is determined using X-ray diffraction by fitting the diffracted peak width. The software used is TOPAS 4.2. Instrumental broadening is considered during the peak fitting, leading to a separation of the instrumental from the sample broadening. The sample contribution is determined using the Lvol-FWHM method, using a single Voigt profile function. Data is collected in the Bragg-Brentano geometry from 2°-30° (2θ), using a step size of 0.02° (2θ).

References:
TOPAS 4.2 Users Manual, Bruker AXS GmbH, Östliche Rheinbrückenstr. 49, 76187 Karlsruhe, Germany Example 7

Long Time Stability of an Organic Semiconductor Layer of Compound (A)

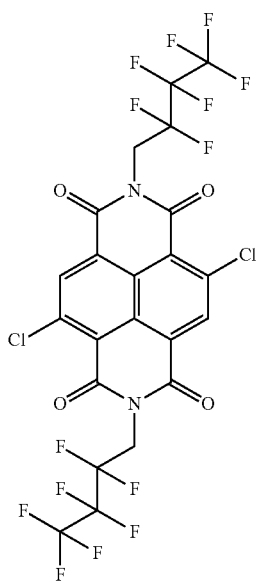

(A)

The OFET from example 1 and a comparative OFET prepared by vacuum deposition of the compound (A) (~$10^{-6}$ mbar) using the same substrate and the same conditions apart from the pressure during deposition are subjected to a long-term storage test under ambient conditions. The results are shown in the following table 1.

TABLE 1

| | mobility μ (normated) | |
|---|---|---|
| month | ambient pressure | vacuum |
| 0 | 1 | 1 |
| 2 | | 0.220 |
| 8 | | 0.077 |
| 20 | 0.319 | |

In the context of the present invention, normated means divided through the mobility value of month 0.

As can be seen, the OFET prepared at ambient pressure using the method of the invention shows an remarkably improved storage stability. The mobility of the OFET prepared under vacuum conditions showed a reduction to only 22% of the original value after 2 month and to about 8% after 8 month, whereas the OFET prepared according to the invention still showed a mobility of 32% of the original value after 20 month.

Example 8

Fabrication of a Hole Transporting Layer of an Organic Light Emitting Diode (OLED)

The ITO substrate used as the anode is first cleaned with an acetone/isopropanol mixture in an ultrasound bath. To eliminate any possible organic residues, the substrate is exposed to a continuous ozone flow in an ozone oven for further 25 minutes. This treatment also improves the hole injection properties of the ITO. Then Plexcore® OC AJ20-1000 (commercially available from Plextronics Inc.) is spin-coated and dried to form a hole injection layer of 40 nm thickness.

Thereafter, the hole transport layer is deposited using the method of the invention. The deposition chamber is filled with an atmosphere of ambient air at ambient pressure. A small amount of the organic semiconducting material N,N'-diphenyl-N,N'-bis(3-methylphenyl)-1,1'-diphenyl-4,4'-diamine (α-NPD) is distributed in a tungsten crucible and placed onto an electrically powered hot plate (source hot-plate) and heated up to a temperature of 350° C. At this temperature, the material evaporates as could be determined by rising fog over the crucible.

The ITO substrate is placed on a second hot-plate (substrate hot-plate) and heated up to a temperature of 100° C. The substrate is placed in short distance (1-2 mm) above the source hot-plate. The source hot-plate, supporting the crucible, is moved with a constant velocity of 1 mm/sec with respect to the substrate hot-plate and the ITO substrate. While crossing below the ITO substrate, the ITO substrate is exposed to the vapor and a homogenous layer of the α-NPD is deposited onto the ITO substrate. To increase the thickness of the deposited layer and ensure a complete coverage of the substrate, the transit of the source hot-plate and therefore the exposure of the ITO substrate to the vapor has been repeated once.

Subsequently, the substrates are transferred in a high vacuum deposition chamber, and the organic materials specified below are applied by vapor deposition in high vacuum ($p=10^{-7}$-$10^{-9}$ mbar) to the substrate at a rate of approx. 0.5-5 nm/min.

A mixture of 10% by weight of emitter compound (D) and 90% by weight of α-NPD (D)

is applied by vapor deposition in a thickness of 20 nm. Subsequently, BAlq (E)

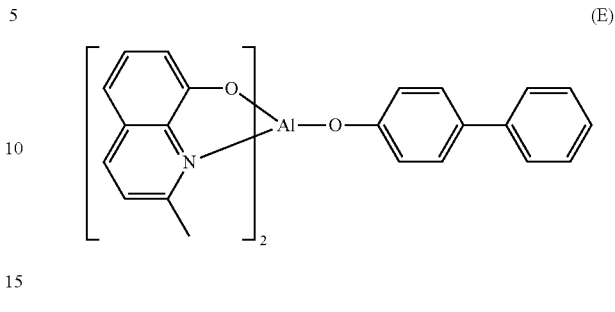

(E)

is applied by vapor deposition with a thickness of 5 nm as blocker. An additional layer of 2,9-dimethyl-4,7-diphenyl-1,10-phenanthroline (BCP) doped with $Cs_2CO_3$ is applied as electron transport layer by vapor deposition in a thickness of 50 nm and finally a 100 nm-thick Al electrode completes the device.

For comparison an OLED without a hole-transport layer was produced. Apart from the deposition of the hole-transport layer using the method of this invention, the preparation of the OLED for the comparison has been identical. Therefore the structure of the OLED for the comparison was as follows: ITO-Anode, a spin-coated layer of Plexcore® OC AJ20-1000, a 20 nm thick mixture of 10% emitter compound and 90% α-NPD, a 5 nm thick layer of BAlq, a 50 nm thick layer of BCP doped with $Cs_2CO_3$, and finally a 100 nm thick Al electrode. All organic layers apart from the spin-coated hole-injection layer, have been deposited in high vacuum ($p=10^{-7}$-$10^{-9}$ mbar). All fabricated parts are sealed with a glass lid and a getter in an inert nitrogen atmosphere.

To characterize the OLED, electroluminescence spectra are recorded at various currents and voltages. In addition, the current-voltage characteristic is measured in combination with the light output emitted. The light output can be converted to photometric parameters by calibration with a photometer. To determine the lifetime, the OLED is operated at a constant current density and the decrease in the light output is recorded. The lifetime is defined as that time which lapses until the luminance decreases to half of the initial luminance. The performance is shown in Table 2

TABLE 2

|  | Lifetime at 8000 nits [h] | Voltage at 300 nits [V] | Voltage at 1000 nits [V] | EQE at 300 nits [%] | EQE at 1000 nits [%] | CIE color coordinate |
|---|---|---|---|---|---|---|
| Whitout HTL α-NPD | 170 | 2.7 | 3 | 9.5 | 9.5 | X = 0.60228 Y = 0.39627 |
| With HTL α-NPD | 215 | 2.6 | 2.8 | 10.49 | 9.87 | X = 0.60635 Y = 0.3923 |

1 nit = 1 cd/m²

The deposition of the hole transport layer of α-NPD by the method of this invention increased the EQE at 300 nits by 1% and reduced the voltage necessary to produce a brightness of 300 nits and 1000 nits in comparison to the OLED without HTL. The lifetime at 8000 nits has been increased from 170 h to 215 h.

Example 9

Fabrication of an Organic Self-Assembled Monolayer (SAM)

Using the method of the invention a self-assembled monolayer of octadecyltrichlorosilane (OTS) has been deposited on silicon dioxide and characterized by water-contact angle measurements.

Preparation:

The deposition chamber is filled with an atmosphere of ambient air at ambient pressure. A silicon wafer with a 300 nm thick layer of thermally grown silicon dioxide is used as a substrate. The substrate is rinsed with ethanol and blown with nitrogen gas, before it is mounted on the substrate hot-plate. A small amount of the commercially available octadecyltrichlorosilane (OTS) (structure: $CH_3(CH_2)_{16}CH_2SiCl_3$) powder is distributed in a tungsten crucible, placed onto the source hot-plate and heated up to a temperature of 170° C. At this temperature, the material evaporates as could be determined by rising fog over the crucible. The silicon substrate on the substrate hot-plate is heated to 100° C. In accordance with example 5 the substrate is placed in short distance (1-2 mm) above the source hot-plate. The source hot-plate, supporting the crucible, is moved with a constant velocity of 2 mm/s with respect to the substrate hot-plate and the silicon substrate. While crossing below the silicon substrate, the silicon substrate is exposed to the vapor and the material is deposited on the silicon substrate. After the deposition, the substrate is dismounted from the hot plate and rinsed with acetone to remove excessive organic material.

Characterization:

OTS is known to form hydrophobic SAMs on the surface of silicon dioxide. To confirm the formation of a hydrophobic self-assembled monolayer using the method of the invention the contact angle of a water droplet (Volume 5 µl) on the surface of the silicon/silicon dioxide wafer before and after the deposition is measured. After the deposition of OTS using the method of this invention the water-contact angle increased by 40° from 55° for the untreated silicon/silicon dioxide substrate to 95° for the OTS treated silicon/silicon dioxide substrate. This confirms the formation of a hydrophobic SAM on the silicon dioxide.

The invention claimed is:

1. A method for depositing at least one layer of an organic material onto a substrate, the method comprising
heating, in a deposition chamber, a source of a solid organic material in an atmosphere comprising air at a pressure of from 50 to 200 kPa to a first temperature to produce a vapor of the organic material, and
depositing, in the same deposition chamber, the organic material from the vapor onto at least one surface of the substrate exposed to the vapor and having a second temperature lower than the first temperature,
wherein no carrier gas is used in the method.

2. A method for producing an electronic device, the method comprising
depositing the at least one layer of the organic material on the substrate by the method of claim 1.

3. The method according to claim 2, wherein the electronic device is an organic electronic device.

4. The method according to claim 1, wherein the at least one layer of the organic material is selected from the group consisting of
an organic semiconducting layer,
a dielectric or an insulating layer,
a layer of at least one surface modifying agent,
a layer with electron-conducting properties,
a layer of a hole-conducting material,
an exciton- and/or electron-conducting layer,
a multiplication layer,
a hole-injecting layer,
a hole-transporting layer,
a light-emitting layer,
an electron-transporting layer,
an electron-injecting layer,
an encapsulation layer,
a light-absorbing layer,
a sensor layer,
a photosensitive layer,
a barrier layer, and
a self-assembled monolayer.

5. The method according to claim 1, wherein the at least one layer of the organic material is an organic semiconducting layer in an organic field effect transistor, an organic solar cell, or an organic light emitting diode.

6. The method according to claim 1, wherein the pressure is from 80 to 120 kPa.

7. The method according to claim 1, wherein the pressure is ambient pressure.

8. The method according to claim 1, wherein the first temperature and the second temperature are both higher than 20° C.

9. The method according to claim 1, wherein the first temperature is from 20 to 350° C.

10. The method according to claim 1, wherein the second temperature is from 20 to 340° C.

11. The method according to claim 1, wherein a difference between the first temperature and the second temperature is from 10 to 330° C.

12. The method according to claim 1, wherein the atmosphere comprises a gas or a gas mixture that is inert towards the organic material.

13. The method according to claim 1, wherein the substrate is moved through the vapor.

14. The method according to claim 13, wherein the substrate is moved through areas with different concentration of the organic material in the vapor.

15. The method according to claim 13, wherein the substrate is repeatedly moved through the vapor.

16. The method according to claim 1, wherein the substrate is arranged above the source of the solid organic material.

17. The method according to claim 1, wherein a distance between the source and the substrate is from 0.1 to 20 mm.

18. The method according to claim 1, wherein the substrate is selected from the group consisting of an inorganic glass, quartz, a ceramic foil or plate, an undoped or a doped inorganic semiconductor, a polymeric material, a filled polymeric material, and a coated or an uncoated metallic foil or plate.

19. The method according to claim 1, wherein a deposition rate of the at least one layer of the organic material on the substrate is from 1 to 200 nm/min.

20. The method according to claim 1, wherein the organic material is selected from the group consisting of a rylene diimide,
a naphthalene diimide,
tetraazaperopyrene,
a diketopyrrolopyrrole,
a fullerene,
a fullerene derivative,
a thiophene compound,
an aromatic compound with at least one condensed thiophene unit,
an acene,
a spiro compound,
a metal complex, and
an organo-silicon and organophosphorus compound, optionally in a form of a self-assembled monolayer.

21. The method according to claim 1, wherein the organic material comprises at least one naphthalene diimide.

22. The method according to claim 1, wherein
the at least one layer of the organic material is a polycrystalline organic semiconductor layer, and
the first temperature is from 20 to 350° C.

23. The method according to claim 1, wherein
the at least one layer of the organic material is a layer of an organic electroluminescent device selected from the group consisting of a hole-injecting layer, a hole-transporting layer, a light-emitting layer, an electron-transporting layer and an electron-injecting layer, and
the first temperature is from 20 to 350° C.

24. The method according to claim 23, wherein the layer is a hole transporting layer of an organic light emitting diode.

25. The method according to claim 1, wherein
the at least one layer of the organic material is a self-assembled monolayer,
the source of the solid organic material is a material capable of forming the self-assembled monolayer, and
the first temperature is from 20 to 350° C.

* * * * *